United States Patent [19]
Machado et al.

[11] Patent Number: 5,517,631
[45] Date of Patent: May 14, 1996

[54] MINIATURE DISK DRIVE HAVING EMBEDDED SECTOR SERVO WITH SPLIT DATA FIELDS AND AUTOMATIC ON-THE-FLY DATA BLOCK SEQUENCING

[75] Inventors: Michael G. Machado, Boulder, Colo.; Clifford M. Gold, Fremont, Calif.; Bruce R. Peterson; Daniel E. Barnard, both of San Jose, Calif.; James H. Do, Milpitas, Calif.

[73] Assignee: Quantum Corporation, Milpitas, Calif.

[21] Appl. No.: 86,824

[22] Filed: Jul. 7, 1993

Related U.S. Application Data

[60] Division of Ser. No. 710,861, Jun. 4, 1991, abandoned, which is a continuation-in-part of Ser. No. 650,791, Feb. 1, 1991, Pat. No. 5,241,546.

[51] Int. Cl.$^6$ ................................................. G06F 13/32
[52] U.S. Cl. ........................ 395/438; 395/310; 395/404; 360/77.08; 360/77.02
[58] Field of Search ...................... 364/200 MS, 900 MS; 395/g333M5, 425 MS, 404, 438; 360/77.02, 77.08, 51

[56] References Cited

U.S. PATENT DOCUMENTS

| | | | |
|---|---|---|---|
| 3,299,411 | 1/1967 | Capozzi et al. | 340/172.5 |
| 3,771,136 | 11/1973 | Heneghan et al. | 340/172.5 |
| 4,016,603 | 4/1977 | Ottesen | 360/135 |
| 4,358,826 | 11/1982 | Bodner et al. | 364/200 |
| 4,375,069 | 2/1983 | Halvorsen et al. | 360/49 |
| 4,669,004 | 5/1987 | Moon et al. | 360/77 |
| 4,811,124 | 3/1989 | Dujari et al. | 360/49 |
| 4,819,153 | 4/1989 | Graham et al. | 364/200 |
| 4,924,427 | 5/1990 | Savage et al. | 364/900 |
| 5,261,058 | 11/1993 | Squires et al. | 395/275 |

FOREIGN PATENT DOCUMENTS

| | | |
|---|---|---|
| 0126610 | 11/1984 | European Pat. Off. . |
| 0300264 A3 | 1/1989 | European Pat. Off. . |
| 0402912 A3 | 12/1990 | European Pat. Off. . |
| 0471314 A1 | 2/1992 | European Pat. Off. . |

OTHER PUBLICATIONS

Worden, "Design Considerations For Dual Density Diskett Controller", *Computer Design*, vol. 17, No. 6, Jun. 1978, pp. 103–110.
"Fault Tolerant Index Detection Pattern For Hard Disk Files", *IBM Tech. Discl. Bull.* vol. 29, No. 12, May 1987, pp. 5350–5351.
Scientific Micro Systems, Data Sheet, OMTI 5000 Data Controller Chips, 1985, four pages.
Cirrus Logic Data Sheet CL-SH350 Integrated Synchronous SCSI Controller, Nov. 1989.
National Semiconductor Data Sheet DP8491 Hard Disk Data Path Electronics Circuit, Sep. 5, 1991.
Silicon Systems Data Sheet SSI 32C452 Storage Controller Jul. 1990.

*Primary Examiner*—Reba I. Elmore
*Attorney, Agent, or Firm*—David B. Harrison

[57] ABSTRACT

A programmable data sequencer transfers fixed length data blocks between variable length storage segments of a magnetic storage disk and a buffer memory within a data storage device. The data sequencer includes a stack memory for holding user byte count values read from a header field preceding each data sector having variable length split storage segments. Each byte count value indicates respective length of a following variable length storage segment, so that the storage capacity of each segment is dynamically determined by the data sequencer in real time by popping the user byte count value from the stack into a storage segment length counter and by counting down the count value within the segment length counter.

13 Claims, 6 Drawing Sheets

MINIATURE DISK DRIVE HAVING EMBEDDED SECTOR SERVO WITH SPLIT DATA FIELDS AND AUTOMATIC ON-THE-FLY DATA BLOCK SEQUENCING

REFERENCE TO RELATED APPLICATION

The present application is a division of U.S. patent application Ser. No. 07/710,861, filed on Jun. 4, 1991, now abandoned, which is a continuation-in-part of U.S. patent application Ser. No. 07/650,791, filed on Feb. 1, 1991, now U.S. Pat. No. 5,241,546.

REFERENCE TO MICROFICHE APPENDIX

Reference is made to a microfiche appendix accompanying the parent patent application, U.S. patent application Ser. No. 07/710,861, filed on Jun. 4, 1991, now abandoned, containing microcontroller routine program listings and detailed schematic circuit diagrams of elements of a disk drive and data sequencer embodying principles of the present invention.

FIELD OF THE INVENTION

The present invention relates to a data sequencer for high capacity, high performance fixed disk drive data storage subsystems. More particularly, the present invention relates to a data sequencer for a fixed disk drive supporting an embedded sector servo arrangement wherein the servo sectors split up the data fields and wherein the sequencer provides automatic data block sequencing with dual function opcodes for reading and writing data blocks in real time without substantial intervention of a supervisory microcontroller.

BACKGROUND OF THE INVENTION

Disk drives, particularly fixed disk drives, are valued on the basis of several factors including size (i.e. sometimes referred to as "form factor"), data storage capacity, random access times between data fields located in disparate concentric data tracks of the storage disk (i.e. sometimes referred to as "access time" or "average access time"), cost per byte stored, and useful life (i.e. sometimes rated as "mean time between failures").

When data tracks are arranged as concentric circles on a circular storage surface, outer tracks or circles are longer and therefore have more useful magnetic storage domains than inner tracks. Also, when storage disks are rotated at a constant angular velocity, the data transducer head "flies" at a faster and somewhat higher altitude above outer storage tracks where relative head to disk velocity is greater, than inner tracks.

One known way to increase data storage capacity is to divide the data storage surface into radial zones of tracks, and to optimize data transfer rate to the smallest track (innermost track) within each particular zone. This approach is sometimes called "zoned data recording". The number of data sectors or fields within each track typically may vary from zone to zone. In order to switch from zone to zone, it is necessary for the disk drive to adapt itself in real time to the number of data sectors and to the new data rate.

Other known ways to increase data storage capacity include varying disk rotation in function of radial position of the data transducer head while maintaining data transfer rate substantially constant, as is the case with optical disk technology; and, varying data transfer rate with each track in function of the radial position of the head, while maintaining disk rotation constant, as is the typical case with fixed disk, "flying head" technology.

Issues confronting the designer of a disk drive include head positioning, and data block transfer. Head positioning is typically carried out by a head positioner servo mechanism and involves "track seeking operations" for moving the data transducer head from a departure track to a destination track throughout the radial extent of the storage area of the disk; and, "track following operations" for causing the data transducer head to follow precisely a particular data track during data block reading/writing operations. In order to provide precise head positioning, during both seeking and following, some servo information must be provided to the head positioner servo. This information may be contained on a special data surface written exclusively with servo information, (called a "dedicated servo surface"), or it may be externally supplied as by an optical encoder coupled to the head positioner arm, or it may be supplied from servo information interspersed or "embedded" among the data fields within each data track. One other approach worth mentioning is provided by the open loop stepper motor head positioner servo wherein positional stability of the head at each selected data track location is provided by electromagnetic detents of the stepper motor.

When servo information is embedded on a data surface having zoned data recording, complications arise in reliably providing robust servo head position information. There must be sufficient embedded information to provide stability to the servo loop and to provide position feedback during high speed portions of track seeking operations, so that velocity or position profiles may be adjusted, based on present head velocity or position at the time of the sample. If the servo information is recorded at the same data rate, and in positional relationship with the data blocks, as has been conventionally employed, the servo architecture is complex in the sense of having to switch data rate and servo position, as zones are crossed over. One example of data zones with switched servo sector locations is provided by the disclosure of Ottesen U.S. Pat. No. 4,016,603, for example. If the servo information is regularly spaced radially across the data storage surface and splits at least some of the data fields into segments, complications arise in reading each split data field as a single data block without error. Also, the disk rotational velocity must be monitored and carefully maintained at a predetermined constant angular velocity.

Data fields are conventionally managed by a data sequencer. One example of a data sequencer is to be found in commonly assigned U.S. Pat. No. 4,819,153, the disclosure thereof being incorporated herein by reference. The data sequencer may include an encoder/decoder for transforming non-return-to-zero (NRZ) data into a coded data format, such as a three to two 1,7 run-length-limited (RLL) code in order to achieve compression of data relative to flux transition density on the data surface. (1,7 RLL coding is based on three cede bits or groups for two unencoded data bits, but results in a four to three overall data compaction rate and therefore permits more data to be recorded on the disk per the number of flux transitions that may be contained within the magnetic storage domains.)

A data sequencer conventionally performs the task of decoding data sector overhead information in order to locate a desired storage location, and to obtain information relating to the correctness or validity of data read back from the storage location. Typically implemented as a state machine, a data sequencer conventionally monitors incoming data flow to locate a data identification (ID) preamble field, a data ID address mark, a sector ID field, the data field itself, and usually some small number of error correction syndrome bytes appended to the end of the data field. The sequencer causes appropriate action to be taken when each of the fields is located. For example, if a data block from the data field of a particular track and sector is being sought, the sequencer compares incoming sector ID field information with the sought-after sector information stored in a register. When a positive comparison occurs, the sequencer causes the bytes read from the data field via a data transducer head and a read channel to be sent into a block buffer memory, and the error correction syndrome remainder bytes to be checked. If there are no detected errors in the data bytes as determined by analyzing the error correction code (ECC) remainder bytes, the block is then sent from the buffer memory to the host computer via a suitable interface, such as Small Computer System Interface (SCSI).

In the disk drive described in a commonly assigned U.S. Pat. No. 4,669,004, each sector was handled individually in response to specific input from the supervisory microcontroller. The disclosure of this patent is incorporated herein by reference. As a particular sector was read, the microcontroller would inform the sequencer whether or not to read the next data sector. This microcontroller intervention occurred for every sector.

In a later design, of which the disclosure found in commonly assigned U.S. Pat. No. 5,005,089, is incorporated herein by reference, a programmable sector counter was preset by the microcontroller to a desired sector count, and the sequencer then processed sectors sequentially until the count in the sector counter was reached. The disk drive examples found in the referenced '004 and '153 patents did not include the complication of zoned data recording and split data fields, and the '089 patent did not include embedded servo sectors. Positioner stability in the '089 disk drive example was provided by an optical encoder coupled between a rotary head positioner and the drive base, as was the case of the disk drive example described in the referenced '153 patent.

Heretofore, while split data recording schemes have been proposed in the prior art, recent proposals have typically tasked the data microcontroller with the responsibility for managing each split data field layout in real time, leading to a tremendous level of bus traffic between the microcontroller and the data sequencer during data read and write operations, and precluding the microcontroller from performing other very useful tasks, such as those related to head position servo supervision, error correction, command and status exchanges with the host computer over the interface bus structure, to cite a few examples. These prior approaches have therefore required a separate data transfer microprocessor, meaning that at least two microprocessors were required to implement an overall disk drive architecture.

SUMMARY OF THE INVENTION WITH OBJECTS

A general object of the present invention is to provide a data sequencer for a data storage device which overcomes limitations and drawbacks of the prior art.

A more specific object of the present invention is to provide a data sequencer for a disk drive employing zoned data recording having data fields split into segments by intervening embedded servo sectors and wherein the data sequencer provides for automatic sequencing of data blocks during writing data to, and reading data from, the split data fields, in a manner which overcomes limitations and drawbacks of the prior art approaches.

Another specific object of the present invention is to provide a unique identification field for each data sector which supports directly automatic data sequencing through each split data field without direct microprocessor intervention.

Another specific object of the present invention is to provide an improved data sequencer for a disk drive which autonomously sequences through split data fields without requiring constant intervention by a microcontroller element to decode the particular format of each split data field, thereby freeing the microcontroller to perform other useful tasks.

A further specific object of the present invention is to provide a data sequencer which includes a count stack for holding counts representing lengths of split data fields.

One more specific object of the present invention is to provide a data sequencer which can read and assemble data blocks from split data fields read from the disk, and write split data fields to the disk without any reprogramming of the sequencer between data block read and write operations.

Yet another specific object of the present invention is to provide a plurality of control fields within a writeable control word for a control state of a data sequencer such that two independent control functions may be performed within the state: either two primary control functions, or a primary and a secondary control function.

A still further specific object of the present invention, a data sequencer is provided which includes a test for zero logic tree which employs fewer gates than heretofore for testing an ECC syndrome remainder value.

One more specific object of the present invention is to provide a data storage disk of a disk drive with a unique split field data and embedded servo sector pattern following a predetermined zoned data track arrangement.

One facet of the present invention is found in a data storage pattern for a disk drive including a storage disk rotating at substantially constant angular velocity and having at least one storage surface defining a multiplicity of concentric data tracks, and a data transducer head positionable at each of the tracks by a head positioning mechanism operating within a digital servo loop. The data storage pattern comprises a series of circumferentially spaced apart, radially extending servo sectors, each servo sector being prerecorded with flux transition patterns defining a servo address mark, a servo sector identification number and servo centerline information, the transition patterns defining the sector identification number and the servo centerline information being resolvable by the disk drive into digital numbers representing head position relative to a said concentric track containing the particular sector. The data tracks are grouped into a plurality of concentric track zones, each zone having a data transfer rate related to radial offset of said zone from a center of rotation of the disk. Each track within a zone is soft-formatted into a predetermined number of data sectors of predetermined user data block storage length. At least some of said sectors are interrupted by at least one of the servo sectors and thereby divided into data segments. Each data sector has a data sector identification field including a plurality of user byte count values indicating the user data storage capacity of each segment of the sector. The count values may therefore be read by a data sequencer the disk drive on-the-fly in order to read a user data block from, and to write a user data block to, the segments.

In one aspect of this facet of the invention, each segment of a data sector includes a preamble field including an address mark, and each said data sector which is divided into plural segments by at least one servo sector includes a data sector identification field as a preamble of a first segment, and a subsequent segment includes a data preamble including a data segment address mark. The data segment address mark is preferably different than the address mark contained within the data sector identification field.

In another aspect of this facet of the invention, the preamble field includes a predetermined sync pattern for enabling a phase locked loop within a data separator of said disk drive to resolve the data transfer rate of the zone of the track containing the particular field, the address mark, an identification field including said count values, a sector and head identifier field for enabling the data sequencer to resolve the particular sector location among the multiple data sectors, and an error detection field for enabling an error correction circuit of the data sequencer to verify correctness of the values contained within the preamble field.

In a further aspect of this facet of the invention, the data transfer rate for the information set forth in the servo sectors is maintained at a fixed rate throughout the radial extent of said storage surface. Also, a predetermined one of the servo sectors preferably contains a prerecorded index pattern indicating a once per revolution index marker for the disk.

In one facet of the invention a programmable data sequencer state machine is provided for a disk drive comprising at least one storage disk rotating at substantially constant angular velocity and having at least one storage surface defining a multiplicity of concentric data tracks. The disk drive includes a data transducer head positionable at each of the tracks by a head positioning mechanism operating within a digital servo loop including a programmed digital microcontroller. The programmable data sequencer comprises a writeable control store including a random access memory area directly addressable by the programmed digital microcontroller for writing sequences of control patterns, there being most preferably a single sequence written for controlling states of the programmable data sequencer during both data read and data write operations to and from the disk surface and a buffer memory. The control patterns preferably include an opcode field control pattern, a count select field control pattern, a control field control pattern, a jump field control pattern, a count field control pattern, and a data field control pattern. The data sequencer thus includes an opcode decoder for decoding values comprising an opcode of a said sequence, a jump field decoder for decoding values comprising at least one of a count select field control pattern and a jump field control pattern, a control field decoder for decoding the control field control pattern, a counter responsive to the count field control pattern, and a data decoder responsive to the data field control pattern.

As one aspect of this facet of the invention, the data storage disk defines a series of circumferentially spaced apart, radially extending servo sectors, each servo sector being prerecorded with flux transition patterns defining a servo address mark, a servo sector identification number and servo centerline information, the transition patterns defining the sector identification number and the servo centerline information being resolvable by the disk drive into digital numbers representing head position relative to a particular concentric track containing the sector. The tracks are grouped into a plurality of concentric track zones, each zone having a data transfer rate related to radial offset of said zone from a center of rotation of the disk. Each said track within a zone is soft-formatted into a predetermined number of data sectors of predetermined user data block storage length. At least some of the data sectors are interrupted by at least one of the servo sectors and are thereby divided into data segments. Each data sector has a data sector identification field including a plurality of user byte count values indicating the user data storage capacity of the particular segment thereof, whereby the count values may be read and processed by the data sequencer on-the-fly in order to assemble a user data block from the segments during a data read operation, and to disassemble a user data block into the segments during a data write operation. In this aspect, the programmable data sequencer state machine further comprises a count stack for storing the user byte count values, and a loadable sector segment counter for receiving sequentially from the count stack each one of the user byte count values for decoding on-the-fly the length of each said segment.

As a further aspect of this facet of the invention the programmable data sequencer state machine comprises a loadable sector counter directly loadable by the programmed microcontroller. The sector counter is responsive to a data clock for counting a preset number of data bytes comprising a data sector. A loadable loop counter is directly loadable by the programmed microcontroller and responds to the data clock for counting a present number of data byte clock periods corresponding to a loop established within sequences of the control patterns. A control field decoder is provided for decoding the control field control pattern and generating the data clock for clocking the sector counter and the loop counter.

As another facet of the present invention, a programmable data sequencer is provided for controlling transfer of fixed length data blocks between variable length storage locations of a storage medium and a buffer memory within a data storage device. The data sequencer includes a writeable control store including a random access memory directly addressable by a programmed digital microcontroller of the data storage device for writing sequences of control patterns, there being dual function control patterns such that a single sequence of control patterns may be written for controlling states of the programmable data sequencer during both data read operations and data write operations to and from the storage medium and the buffer memory, a control pattern decoder for decoding the control patterns into functional values for controlling operations within the data sequencer, and a stack memory for holding user byte count values indicating respective lengths of said variable length storage locations so that the storage capacity of each said storage location is determined by the data sequencer automatically as a user byte count value associated with a particular variable length storage location is provided at the stack memory.

As a further facet of the present invention, a method is provided for controlling transfer of fixed length data blocks between variable length storage locations of a storage medium such as a rotating disk and a buffer memory of a data storage device such as a disk drive. In this facet of the invention, the method comprises the steps of:

writing sequences of control patterns from a programmed digital microcontroller of the device directly to a writeable control store of a data sequencer of the device, decoding the control patterns into functional values for controlling operations within the data sequencer, transferring user byte count values indicating respective lengths of segments of the variable length storage locations from a data header of one of the storage locations directly into a byte count values stack of the data sequencer as the data header is read by a data transducer of the device, automatically transferring each user byte count value to a byte counter of the data sequencer so that the storage capacity of each said segment is determined by the sequencer automatically by the value held in the byte counter.

As another facet of the present invention, a method is provided for controlling transfer of data blocks between storage locations of a storage medium and a buffer memory of a data storage device. In this facet, the method comprises the steps of:

writing sequences of control patterns from a programmed digital microcontroller of the device directly to a writeable control store of a data sequencer of the device, there being dual function control patterns such that a single sequence of control patterns may be written for controlling states of the programmable data sequencer during both data read operations and data write operations to and from the storage medium and the buffer memory, and decoding the control patterns into functional values for controlling operations within the data sequencer during both data read operations and data write operations without intervention by the programmed digital microcontroller.

These and other objects, advantages, aspects, facets and features of the present invention will be more fully understood and appreciated by those skilled in the art upon consideration of the following detailed description of a preferred embodiment, presented in conjunction with the accompanying drawings.

DETAILED DESCRIPTION OF A PREFERRED EMBODIMENT

Figure 1:
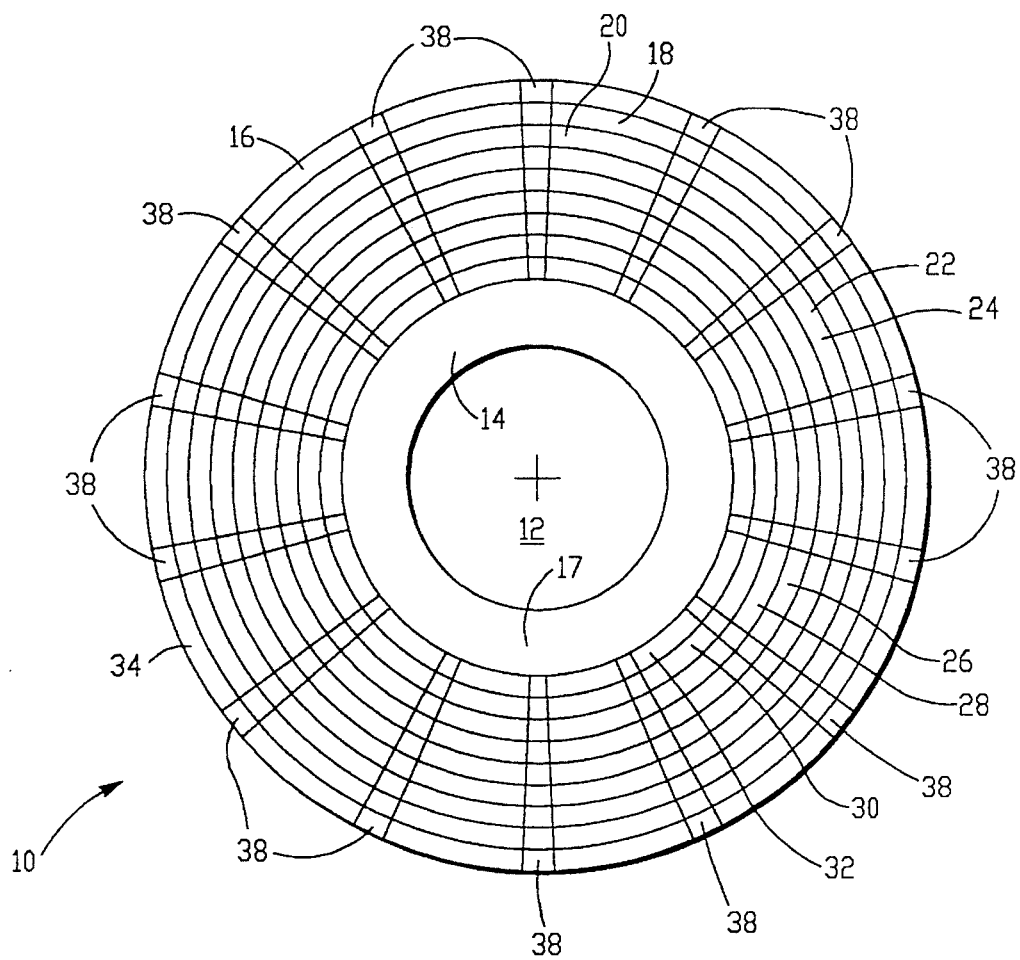
FIG. 1 is a plan view of a disk data storage surface including data track zones and radially/circumferentially aligned embedded servo sectors in accordance with the principles of the present invention.

Issues confronting a designer of a high capacity disk drive including an embedded sector servo are perhaps best understood by considering the FIG. 1 plan view of a disk data storage surface. A rotating storage disk 10, which may be 2.5 inches in diameter, or 1.8 inches in diameter, or larger or smaller, is formed of suitable substrate material such as metal or glass and is coated with e.g., a magnetic storage medium such as a thin film medium vacuum sputter deposited onto the substrate. The disk 10 defines a central opening 12 to enable a rotating hub securely to clamp the disk to a disk spindle. Between an inner landing zone area 14 and an outer peripheral zone 16, a data storage area of a multiplicity of concentric data tracks is defined. The tracks are arranged into e.g. eight data zones, 18, 20, 22, 24, 26, 28, 30 and 32, extending from a radially outermost zone 18 to a radially innermost zone 32. A system information zone 34 lies radially outwardly just beyond the outer zone 18, and a diagnostics and guard zone 36 lies just inside of the inner landing zone area 14. Since the number of magnetic storage domains varies directly in function of disk radius, the tracks of the outermost zone 18 will contain considerably more user data than can be contained in the tracks located at the innermost zone 32.

Outermost zone 18 includes e.g. 110 concentric data tracks, each having 58 data sectors, with a storage density of 43,334 bits per inch (BPI) (32,500 flux changes per inch encoded in 1,7 run length limited code). The raw data rate is 18.13 megabits per second, with a raw code rate of 27.20 Megahertz (MHz). Zone 20 includes e.g. 109 concentric data tracks, each having 56 data sectors per track, with a storage density of 44,269 bits per inch (32,202 flux changes per inch (FCI), a raw data rate of 17.45 megabits per second (MBPS) and a raw code rate of 26.18 MHz. Zone 22 includes e.g. 109 concentric data tracks, each having 52 data sectors per track, a storage density of 42,382 MBPS (31,787 FCI), a raw data rate of 15.69 MBPS and a raw code rate of 23.53 MHz. Zone 24 includes e.g. 109 data tracks, each having 52 sectors per track, with a storage density of 45,334 MBPS (34,008 FCI) and a raw data rate of 15.69 MBPS and a raw code rate of 23.53 MHz. Zone 26 includes e.g. 109 concentric data tracks, each having 47 data sectors per track, a storage density of 45,900 BPI (34,425 FCI), a raw data rate of 14.77 MBPS and a raw code rate of 22.15 MHz. Zone 28 includes e.g. 108 concentric data tracks, each having 44 data sectors, a storage density of 47,008 BPI (35,256 FCI), a raw data rate of 14.00 MBPS and a raw code rate of 21.00 MHz. Zone 30 includes e.g. 108 concentric data tracks each having 41 data sectors, a storage density of 47,294 BPI (35,471 FCI), a raw data rate of 12.98 MBPS and a raw code rate of 19.43 MHz. Innermost data zone 32 includes e.g. 108 concentric data tracks each having 39 sectors per track, a storage density of 48,371 BPI (36,278 FCI), a raw data rate of 12.09 MBPS and a raw code rate of 18.13 MHz. The outer system zone 34 includes e.g. 14 concentric data tracks following e.g. the Zone 32 format, and the inner diagnostics zone 36 includes 1 track also following the Zone 32 format. A guard band 37 of four tracks lies immediately inside of the diagnostics zone 36. A landing zone LZ lies immediately inside of the guard band and diagnostics zone 36. The landing zone LZ is provided to implement a contact start-stop head flying arrangement for the disk drive.

FIG. 1 also depicts a series of radially extending, regular servo sectors 38. In this particular example, there are preferably 52 radial servo sectors 38 (shown diagrammatically as several narrow spokes in FIG. 1) equally spaced around the circumference of the disk 10. With disk rotation maintained at 16.667 milliseconds per revolution (3600 RPM), each servo sector takes up about 24.125 microseconds of the rotational interval. Other drive overhead includes the FIG. 3 data sector ID and data fields. While the number of data sectors per track varies from zone to zone, it is apparent from inspection of FIG. 1 that the number of embedded servo sectors per track remains constant. In the present example the servo sectors 38 extend radially and are circumferentially equally spaced apart throughout the extent of the storage surface of the disk 10 so that the data transducer head 114 samples the embedded servo sectors 38 while reading any of the concentric tracks 10 defined on the data storage surface.

Each data sector is of a predetermined fixed storage capacity or length (e.g. 512 bytes of user data per data sector); and, the density and data rates vary from data zone to data zone. Accordingly, it is intuitively apparent that the servo sectors 38 interrupt and split up at least some of the data sectors or fields, and this is in fact the case in the present example. The servo sectors 38 are preferably recorded at a single data cell rate and with phase coherency from track to track with a conventional servo writing apparatus at the factory. A laser servo writer and head arm fixture suitable for use with the servo writer are described in commonly assigned U.S. Pat. No. 4,920,442, the disclosure of which is hereby incorporated herein by reference. A presently preferred servo sector pattern is described in copending U.S. patent applications Ser. Nos. 07/569,065 filed on Aug. 17, 1990, entitled "Edge Servo For Disk Drive Head Positioner, now U.S. Pat. No. 5,170,299 and 07/710,172, filed Jun. 4, 1991 and entitled "Servo Data Recovery Circuit for Disk Drive Having Digital Embedded Sector Servo" abandoned in lieu of U.S. continuation application Ser. No. 08/180,096, filed on Jan. 11, 1994, and now U.S. Pat. No. 5,420,730, the respective disclosures of which are hereby incorporated by reference. A very robust digital head position servo loop servo is realized, as described in the referenced U.S. Pat. No. 4,669,004 as further improved by the disclosures of the patent applications noted directly above.

Figure 2:
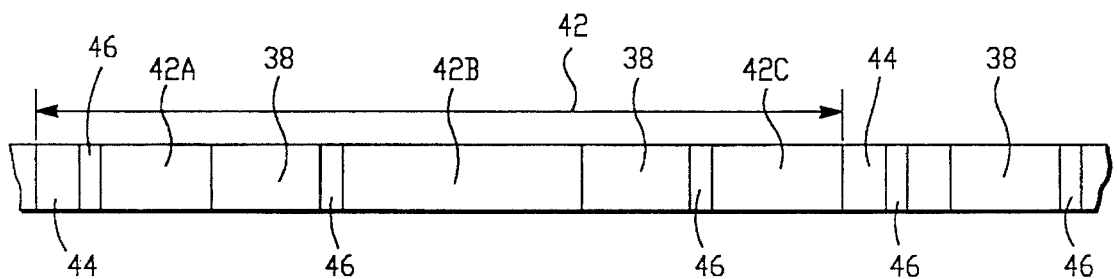
FIG. 2 is a graph of a portion of a data track showing a data field being split into segments by recurrent servo sectors. ID and data headers for the data segments include fault tolerant address marks in accordance with principles of the present invention. While the FIG. 2 graph is a rectilinear depiction, within disk drives, the tracks are typically concentric, and a truer representation would show the FIG. 2 segment as an arc segment of a circular track pattern.

As shown in FIG. 2, a data track 40 includes a data block 42 for storage of a predetermined amount of user data, such as 512 or 1024 bytes of user data, recorded serially by 1,7 RLL code bits in data field areas of the depicted track segment. The data block 42-1 is interrupted by several servo sectors 38 which contain embedded servo information providing head position information to the disk drive via e.g. a thin film or metal-in-gap (MIG) data transducer head 114 (FIG. 4) which is positionable by a rotary voice coil actuator 108 radially with respect to the data surface in order to read the data and servo information contained in the track 10, for example, as well as some or all of the other data tracks on the particular surface. The data block 42 includes an ID header 44 at the beginning of the data block and a data header 46 immediately preceding each data field segment including the segment 42A following the ID header 44, and the segments 42B and 42C following interruption by servo sectors 38. The data header 46 is written at the same time that data is written to the segments 42, and a write splice therefore exists just before each data header 46.

Figure 3:
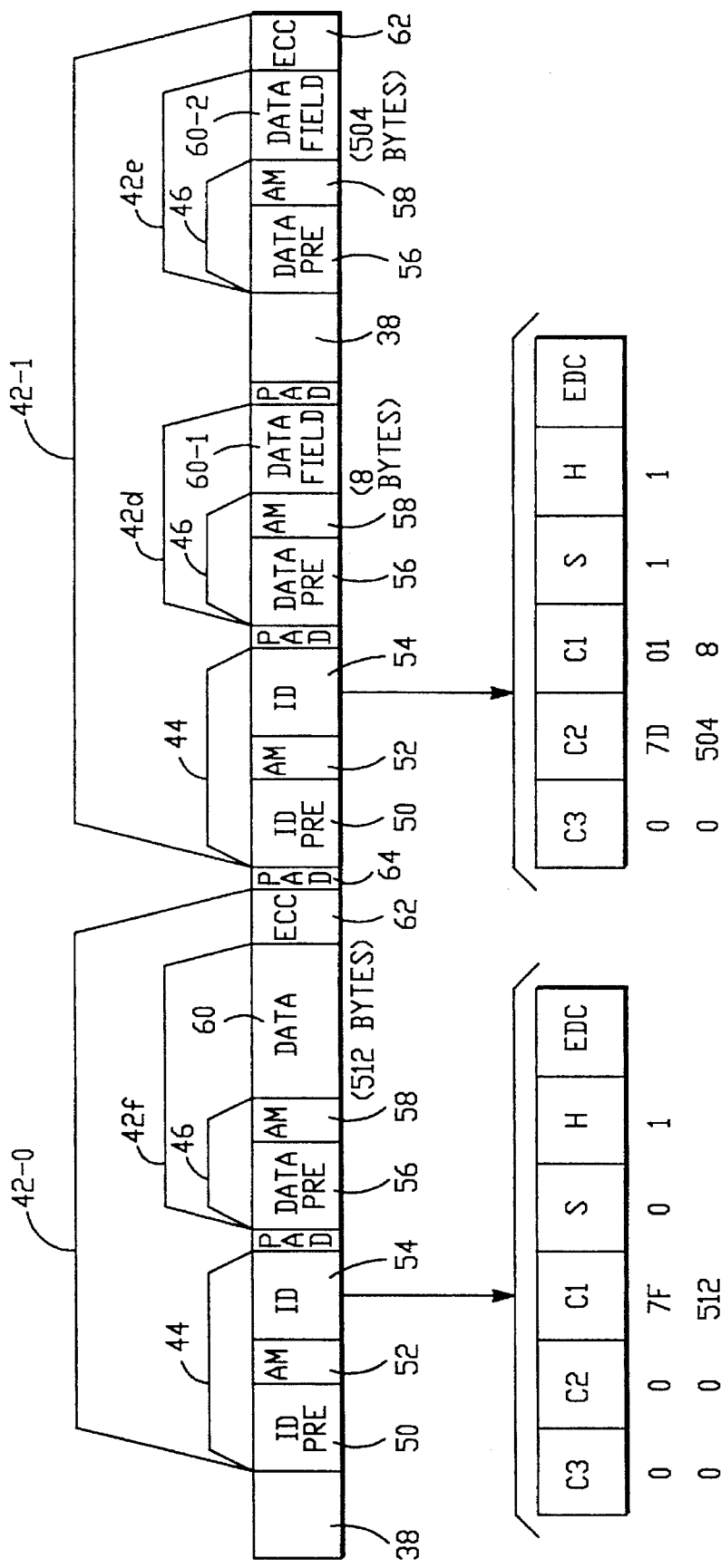
FIG. 3 is a more detailed view of the FIG. 2 data track portion.

As shown in greater detail in FIG. 3, the ID header 44 typically may include an ID preamble 50, an ID-type address mark 52, an ID field 54 containing three or four count bytes, a sector number byte, a head number byte, and a Reed Solomon error detection code. The data header 46 contains a data preamble field 56 and a data address mark 58. The data header is immediately followed by a user data field 60 for storing the predetermined number of user data bytes, such as 512 bytes, for example. The user data field segment 60 is followed by an ECC field containing e.g. 12 ECC syndrome remainder bytes. A pad field 62 follows the ECC field and separates a first data sector or block 42-0 from a second data block 42-1, for example. Also, an ID/data header pad field 63 separates the ID header 44 from the data header 46 and contains the write splice.

The first data block 42-0 is shown in FIG. 3 as being uninterrupted throughout its circumferential extent. However, the block 42-1 is interrupted by a servo sector 38 and includes two data segments 42d and 42e, for example. Each split data segment, such as the segments 60-1 and 60-2 shown in the second sector 42-1 of FIG. 3, is preceded by a data header 46 including a data preamble field 56, and a data address mark 58. Immediately following the last data field segment 60-2 is the error correction field 62 containing the ECC remainder bytes.

In accordance with principles of the present invention, the count bytes, e.g. C1, C2 and C3, within the ID data field 54 are used to control automatic data block sequencing operations of a data sequencer 152 (FIG. 6). These count bytes enable the sequencer to determine automatically, and without microcontroller intervention, the layout of the particular data sector 42 to be sequenced. In other words, the count bytes C1, C2 and C3 provide the respective byte lengths of each data segment 60 as interrupted by the fixed location servo sectors 38. In the FIG. 3 example the first data sector 42-0 is not split up into more than one data segment. Accordingly, count bytes C3, C2 and C1 are respectively 0, 0 and 7F (Hex, 127 decimal, the count bytes being divided by 4 to save register room in the sequencer 152). This pattern means that the first data segment 42F contains all of the data bytes, and there are no second (C2) or third (C3) segments.

A split data field example is encountered in data sector 42-1. Therein, the count bytes C3, C2 and C1 are respectively 0, 70, 01. This pattern of count bytes indicates that the first data segment 42D (C1) contains eight user bytes, and the second data segment 42E contains 504 bytes, and that there is no third segment in this particular example.

The count bytes are arranged in reverse order, so that they may be pushed onto a byte count stack 234 (FIG. 6) provided within the sequencer 152, as explained in greater detail hereinafter. The last count C1 for the first segment 42D, will be the first one popped off the stack 234 and loaded into a byte counter 236 of the sequencer 152 as the first segment of the particular data sector 42 is being read from or written to in real time. When the next segment is reached, the next count C2 for the second segment 42E is then popped off of the stack 234 and into the byte counter 236, and when the third segment is reached, the third count (C3) will be popped off of the stack 234 and loaded into the byte counter 236. This activity does not take place for byte count values of zero.

In this manner, the data sequencer 152 is able to reassemble automatically the data sectors 42 into unbroken continuous byte sequences which in the case of data reads from the disk are sent into a data block buffer preparatory to being transferred to the host. For incoming data blocks when data is being written to a storage surface of the disk 10, the sequencer 152 uses the count bytes in order to know how many bytes to sequence to the disk surface for each data sector data segment.

As already noted, each data sector 42 includes within the ID field 54 several error detection bytes which are used to verify the integrity of the information read back from the particular data ID field. These error detection code bytes (EDC) are preferably Reed Solomon syndrome remainder bytes which are coded from a code compatible with the error detection syndrome remainder bytes contained in the ECC fields 62. The EDC bytes as well as the ECC bytes are checked in real time by an ECC circuit within the sequencer. A presently preferred EDC/ECC circuit is described in a commonly assigned, copending parent U.S. patent application, Ser. No. 07/650,791, filed on Feb. 1, 1991, the disclosure of which is hereby incorporated by reference.

Figure 4:
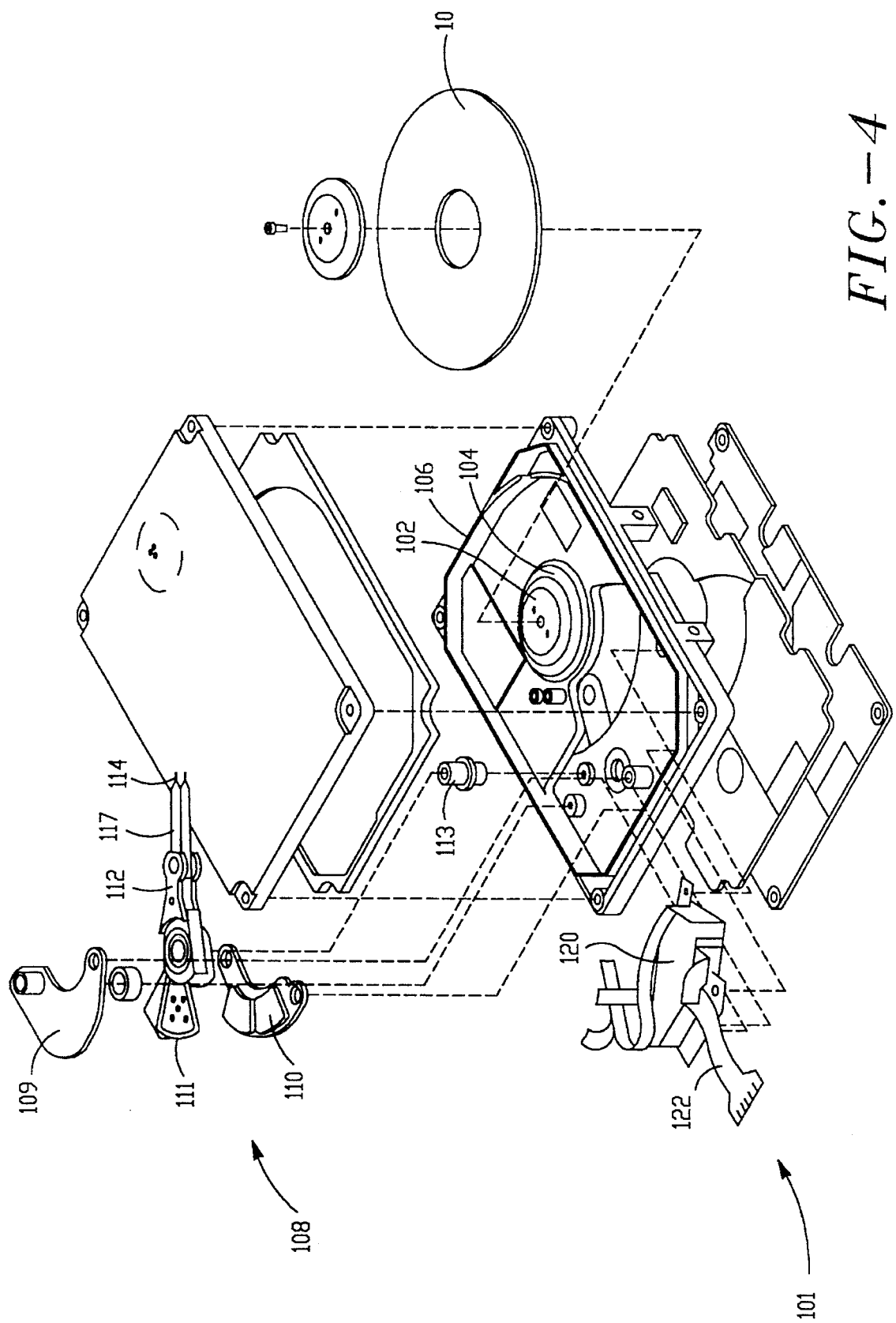
FIG. 4 is an exploded isometric view of a submicro-Winchester fixed disk drive head and disk assembly, incorporating principles of the present invention.

Turning now to FIG. 4, a head and disk assembly 101 of an exemplary fixed disk drive data storage subsystem 100 is depicted in an approximate real size plan view. The data storage disk 10 may have any suitable diameter. While two and one half inches is presently preferred, larger disk diameters, such as three and one half inches, five and one quarter inches, eight inches or larger, or smaller disk diameters, such as 1.8 inch, or smaller, are also clearly within the contemplation of the present invention. The data storage disk 10 is mounted upon a rotating spindle assembly 102 which is rotated by an in-spindle brushless DC spindle motor 104 relative to a frame or base 106. Most preferably, motor bearings formed as a part of the spindle motor 104 are used to rotate the spindle assembly 102 relative to the base 106; and, the spindle motor itself is mounted to the base casting 106, as is conventional in miniature head and disk assemblies.

A motor driver circuit 107 (FIG. 5) is provided to commutate e.g. the three-phase windings of the brushless motor 104. Hall sensors, not shown, may be provided in order to determine the position of the rotary permanent magnet element relative to the fixed windings and poles of the motor 104 and provide feedback control information to the motor driver circuit 107 in conventional fashion.

A plurality of e.g. thin film or MIG data transducer heads 114a and 114b are respectively associated with opposite major data storage surfaces of the at least one data storage disk 10. The data transducer heads 114 are preferably, although not necessarily, mounted to in-line aligned load beams 117 which in turn are attached to vertically aligned arms of an arm assembly 112 of a mass balanced rotary voice coil actuator 108. The heads 114a and 114b operate conventionally in a contact-start-stop relationship with respect to the data surface, and they "fly" above the surface during operations upon an air bearing as is conventional with Winchester fixed disk technology, for example. During the assembly process, the heads 114 may be loaded onto the data storage disk in accordance with the teachings of commonly assigned U.S. patent application Ser. No. 07/610,306, now U.S. Pat. No. 5,027,241, the disclosure of which is incorporated herein by reference.

A head position actuator mechanism, most preferably a mass-balanced rotary voice coil actuator 108, includes a permanent magnet voice coil motor having an upper flux return plate 109 and a lower flux return plate securing e.g. a pair of highly magnetic flat permanent magnets 110 of opposite magnetic polarity formed of a suitable material, such as a rare earth element such as nyodmium. A flat, wedge-shaped moving coil 111 defining an inner space a mass counterbalance and being integrally formed with or otherwise mounted to a rotary actuator 112 moves in a magnetic gap formed between the upper flux return plate 109 and the permanent magnets 110. The rotary actuator 112 is journalled about bearings mounted to a post 113 secured to and extending upwardly from a floor wall of the base 106. To provide additional rigidity, the actuator post may also be secured to a top cover by a removable screw, should additional rigidity be needed or desired. A conventional elastomeric crash stop limits radial displacement of the rotary actuator 112.

As noted, the rotary actuator 112 includes a bearing assembly mounted to the base 106 via the actuator post 113 so that the rotary actuator 112 is free to rotate relative to the disk 10 over an arcuate radial locus of limited rotational displacement. Current passing through the coil 111 in one direction results in application of a rotary reaction force of the rotary actuator 112 in one direction, while current flow in reverse direction results in a rotary force being imparted to the rotary actuator 112 in an opposite direction. The rotary actuator 112 thus moves a ganged, substantially in-line head arm assembly across the surfaces of the disks within the drive. The head arm assembly includes a separate in-line load beam 117 for each data transducer head 114. In the present single storage disk example given in FIG. 4, the rotary actuator 112 supports e.g. two oppositely aligned data transducer heads 114, so that both surfaces of the disk 10 are used for storage and retrieval. If two or more spaced apart disks are included within the disk drive 100, at least one data head 114 is provided for each surface and is commonly positioned with the other heads 114 by movement of the rotary actuator assembly 112.

An electromagnetic shipping latch engaging a protrusion formed e.g on the rear end of the coil molding 111 locks the head arm assembly to place the heads at the inner landing zone defined on the data surface. During a power-down sequence, power generated from kinetic energy in the spindle motor is directed into the coil 111 to move the head arm assembly to the landing zone, and is also directed into the latch to cause it to engage the actuator when the landing zone has been reached. Further details of a presently preferred electromagnetic shipping latch are set forth in commonly assigned, copending U.S. patent application Ser. No. 07/696,629 filed on May 7, 1991, and entitled "Bistable Magnetic/Electromagnetic Latch for Disk File Actuator", now U.S. Pat. No. 5,170,299, the disclosure of which is hereby incorporated by reference.

Magnetic flux transitions comprising both user data and servo sector data 38, are written by or read by the head 114 during data write or read operations. The data read by the head 114 is passed through a preamplifier circuit 120 (FIG. 5) which also provides head selection and write driving functions during data write operations. A conventionally available integrated circuit, such as the SSI 32R4610 four channel thin film head read/write device made by Silicon Systems, Inc., Tustin, Calif., or equivalent, is presently preferred for implementation of the circuit 120. The circuit 120 enables four separate heads 114 to be individually selected, and the circuit 120 is preferably mounted within a space defined within the head and disk assembly 101 upon a Mylar circuit substrate 122 which carries conduction traces leading to connections at an external printed circuit board carrying the other circuit elements of the disk drive 100. The circuit 120 is placed as close to the heads 114 as possible in order to reduce connection lead length, and to improve signal to noise ratios for each of the heads 114.

Figure 5:
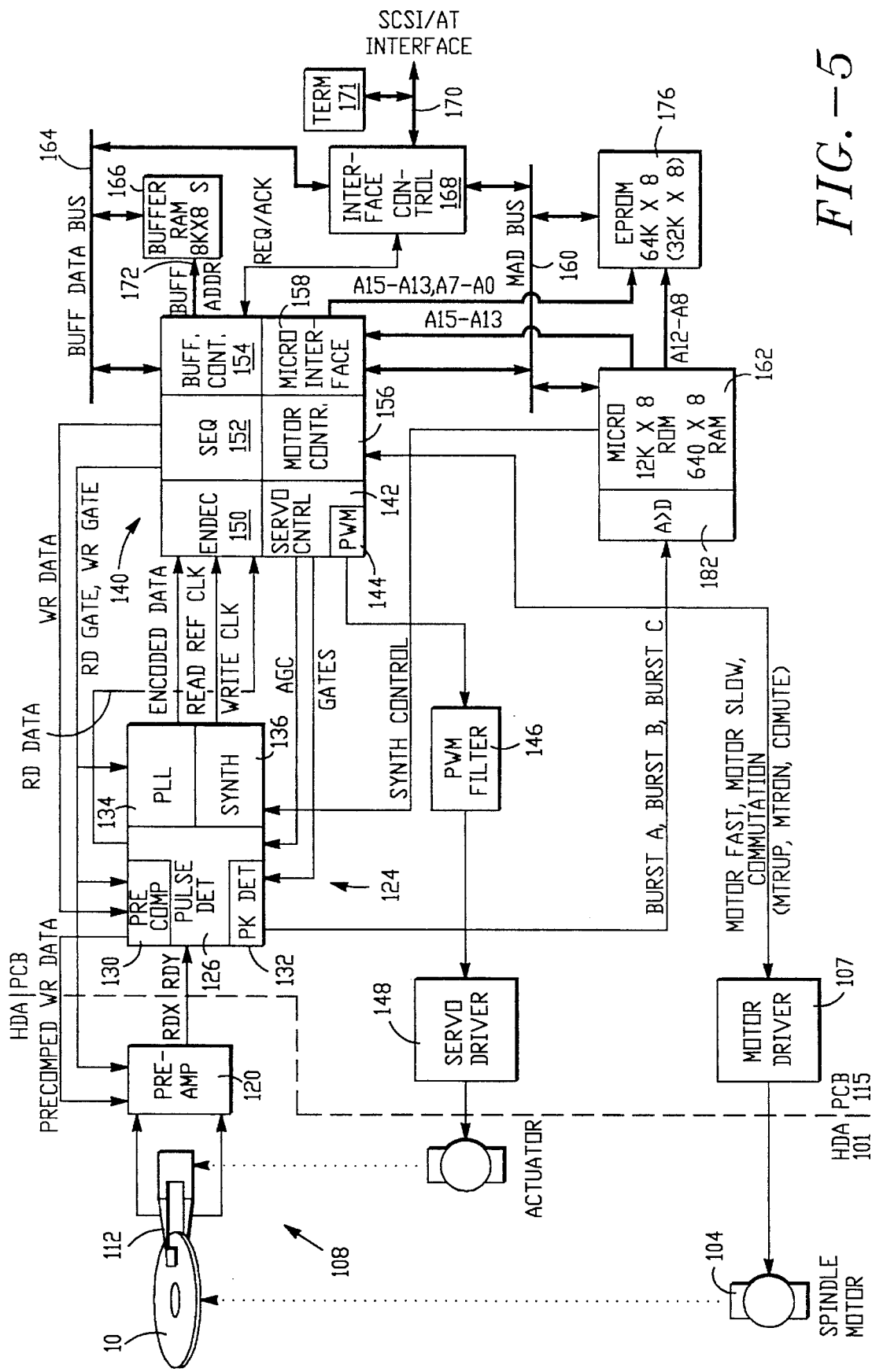
FIG. 5 is a detailed block diagram of an electrical control system for controlling operation of the FIG. 4 head and disk assembly and incorporating principles of the present invention.

Turning now to the system block diagram provided in FIG. 5, the generally vertical dashed line represents a printed circuit board 115 which carries all of the electronic circuit elements shown in FIG. 5 other than the preamplifier 120, and marks the demarcation between the head and disk assembly 101 and the circuit board 115. As shown in FIG. 5 analog flux transitions from a selected head 114 are amplified by a preamplifier within the circuit 120 and are then passed on to a circuit 124 including a pulse detector 126. Gain of the pulse detector circuit 126 is controlled by an AGC control circuit 128 also contained within the circuit 124. The pulse detector circuit 126 decodes the analog flux transitions into shaped digital edges or pulses representative of raw encoded data. The circuit 124 also includes a precompensation circuit 130 for precompensating data to be written to the disk 10 during data writing operations, and a peak detector 132 for detecting peak amplitudes of servo bursts contained within the servo sectors 38 during track settling operations at the end of track seeking operations, and during track following operations.

The circuit 124 also includes a phase locked loop (PLL)134 for locking onto incoming data at a data rate predetermined for the particular data zone, as previously explained. A data frequency synthesizer 136 is provided for selectively generating the particular data transfer rate applicable within a track zone and supplies the synthesized frequency to the PLL 134. The circuit 124 is preferably contained within a single low power VLSI package, such as a type DP8491 made by National Semiconductor Corporation, or equivalent. The circuit 124, as is true with the entire system 100, preferably operates upon a single +5 volt power supply.

The data stream leaving the circuit 124 enters another circuit 140. The circuit 140 is also a single low power VLSI package operating on a +5 V power supply, and it includes a servo data decoder circuit 142. The circuit 140 also includes a pulse width modulator 144 for sending strings of controlled duty cycle pulses generated from values supplied from the microcontroller 162 through a low pass filter 146 to control a servo driver circuit 148. The servo driver circuit 148 generates and applies drive currents to the coil 111 of the rotary actuator 108. Essentially, a digital servo is realized, as described in the referenced commonly assigned U.S. Pat. No. 4,669,004, as improved by the improvements described in the referenced copending U.S. patent applications Ser. Nos. 07/569,065 filed on Aug. 17, 1990, entitled "Edge Servo For Disk Drive Head Positioner, now U.S. Pat. No. 5,170,299 and U.S. patent application Ser. No. 07/710,172 filed on Jun. 4, 1991, abandoned, continued by U.S. patent application Ser. No. 08/180,096, filed on Jan. 11, 1994, and now U.S. Pat. No. 5,420,730 and entitled "Servo Data Recovery Circuit for Disk Drive Having Digital Embedded Sector Servo".

The servo data decoder circuit 142 preferably includes a synchronizer for synchronizing incoming raw data to an internal clock, a first slave state machine for detecting servo sync and a unique pattern within a servo address mark field, and a second slave state machine for decoding data bits included within the servo address mark field, an index bit field, and a Gray coded data field indicating the particular surface and track number. The servo data decoder circuit 142 also includes a sector timer which generates and puts out expected servo sector times within the circuit 140 based upon detection of each servo address mark, and a delay timer for timing delay periods associated with centerline burst fields included within each servo sector, and for putting out delay gates, the gates being used to control operation of the peak detector 132. Functional operations within the servo decoder circuit 142 are managed and supervised by a servo master state machine which controls and monitors operations of the two slave state machines and determines detection of the servo address mark, an index mark, and collects the bits comprising the Gray coded track identification number. This number is passed onto the microcontroller 162 which decodes it and determines head position during track seeking and settling operations of the drive.

The circuit 140 also includes an encoder/decoder 150 which decodes incoming data from e.g. 1,7 RLL code to NRZ format, and encodes data from the host in NRZ format into e.g. 1,7 RLL code. The encoder/decoder 150 is substantially as described in a commonly assigned U.S. Pat. No. 4,675,652, the disclosure of which is hereby incorporated by reference. Following the encoder/decoder 150 is a data sequencer 152. The data sequencer is described hereinafter in greater detail in conjunction with FIGS. 6A and 6B. It basically functions to sequence data to and from the storage disk 10.

A buffer controller 154 controls operation of a buffer memory 166. While otherwise conventional, the buffer controller 154 includes a microcontroller buffer access circuit enabling the microcontroller 162 to write bytes to, and read bytes from, specified addresses in the buffer memory 166 in accordance with values supplied over the bus 160. An address control generates and applies addresses to the buffer memory 166 over a buffer address bus 172. A master control state machine generates the necessary clocks for clocking data blocks into and out of the buffer memory 166 and supplies those clocks to the address control. A bus multiplexer within the buffer controller 154 selects between data from a sequencer first-in, first-out buffer (FIFO) 196 (FIG. 6B) and the microcontroller buffer access circuit.

The circuit 140 further includes a motor control circuit 156 which monitors disk rotational speed. The motor driver circuit 107 may provide a once-per-revolution index signal which may be compared against an internal timer, or the time between index marks provided by the servo control circuit 142 may be counted. Speed up (MTRUP) or slow down (MTRDN) signals are sent by the motor control circuit 156 to the motor driver 107. Finally, the circuit 140 includes a microprocessor interface 158 which connects directly to an internal control bus structure 160 over which control data and control address values are sent to and from a programmed digital microcontroller 162.

An internal data bus structure 164 connects the buffer controller 154 to a buffer memory 166 and also to an interface circuit 168. The interface circuit 168 includes bus drivers and other circuitry, such as a data FIFO buffer for buffering data flow from an external bus 170 and the buffer memory 166. The circuit 168 may also include a state machine for decoding bus level commands. Internal registers may be provided for receiving commands from the microcontroller 162.

The interface circuit 168, while conventional, is preferably configured to conform to the American National Standards Institute (ANSI) standard X3T9.2/82-2 Revision 17B at conformance level 2 for the small computer standard interface (SCSI), for example. It is controlled by a SCSI interface service routine executed by the microcontroller 162. The interface 168 includes hardware for controlling all critical timing operations on the SCSI interface bus. Decoding of commands, time-outs, and other non-critical timing operations are performed by the SCSI service routine. The interface circuit 168 also includes on-board drivers for at least a single ended SCSI bus 170.

The interface circuit 168 includes an interface control block which connects to the bus 160 and enables the interface circuit 168 to appear to the microcontroller 162 as an array of directly addressable registers. By writing to these registers, the microcontroller 162 may arbitrate for the SCSI bus 170, select another device on the bus 170 and initiate data transfers. By reading these registers, the microcontroller 162 may determine the status of the interface circuit 168 and of the data transfer including error detection.

The buffer control 154 generates addresses for the buffer memory 166 and puts them out over an address bus 172. The microcontroller 162 puts out addresses over an address bus 174 to the microcontroller interface circuit 158. The microcontroller 162 directly addresses a program memory 178 over an address bus 176, and the circuit 158 latches and presents other ones of the address lines to the program memory 178 over an address bus 180.

Preferably although not necessarily, the programmed microcontroller 162 is a single monolithic microcontroller such as the NEC 78322, or equivalent, operating in a two-phase time divided arrangement per servo sector wherein a first time interval upon the arrival of each servo sector is devoted to servo control operations for head positioning, with a second and following time interval devoted to other tasks, including error correction operations, for example. An overview of this form of disk drive architecture is provided in the referenced U.S. Pat. No. 4,669,004. A hierarchical system for managing the tasks performed by the microcontroller 162 during the second and following time interval is disclosed in the referenced U.S. Pat. No. 5,005,089.

An analog to digital converter 182 within the microcontroller 162 enables peak values detected by the peak detector 132 to be digitized and processed most preferably in accordance with a method described in the referenced co-pending U.S. patent application Ser. No. 07/569,065, reference to which is made for further particulars.

Further structural and functional details of the presently preferred disk drive architecture are found in a commonly assigned, copending U.S. patent application Ser. No. 07/710,177, filed on Jun. 4, 1991, and entitled "Miniature Fixed Disk Drive" now U.S. Pat. No. 5,255,136 the disclosure of which is hereby incorporated herein by reference.

Figure 6A:
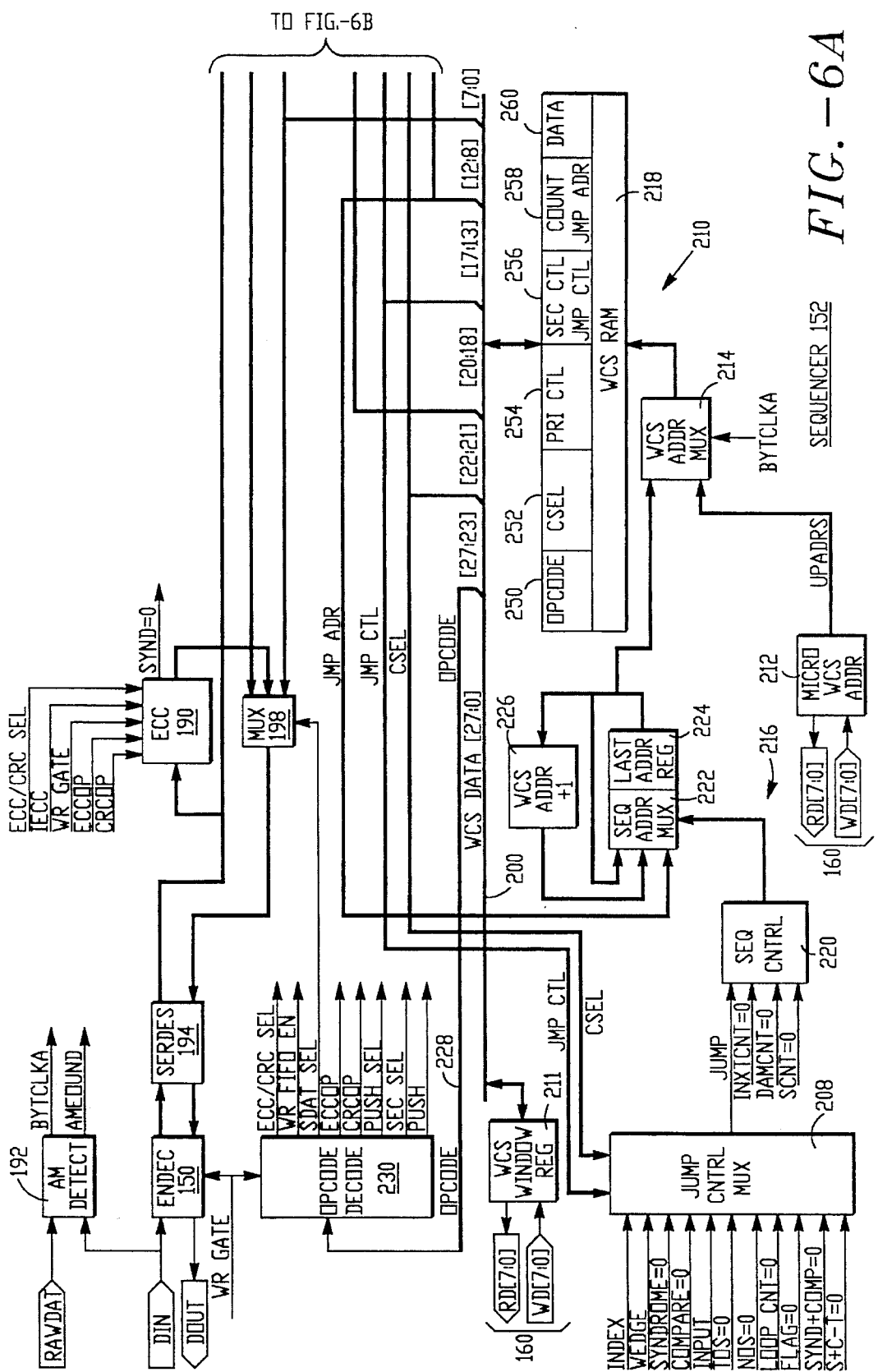
FIGS. 6A and 6B are a detailed block diagram of a data sequencer element of the FIG. 5 control system, with FIG. 6A providing the left panel, and FIG. 6B the right panel, of the block diagram.
Figure 6B:
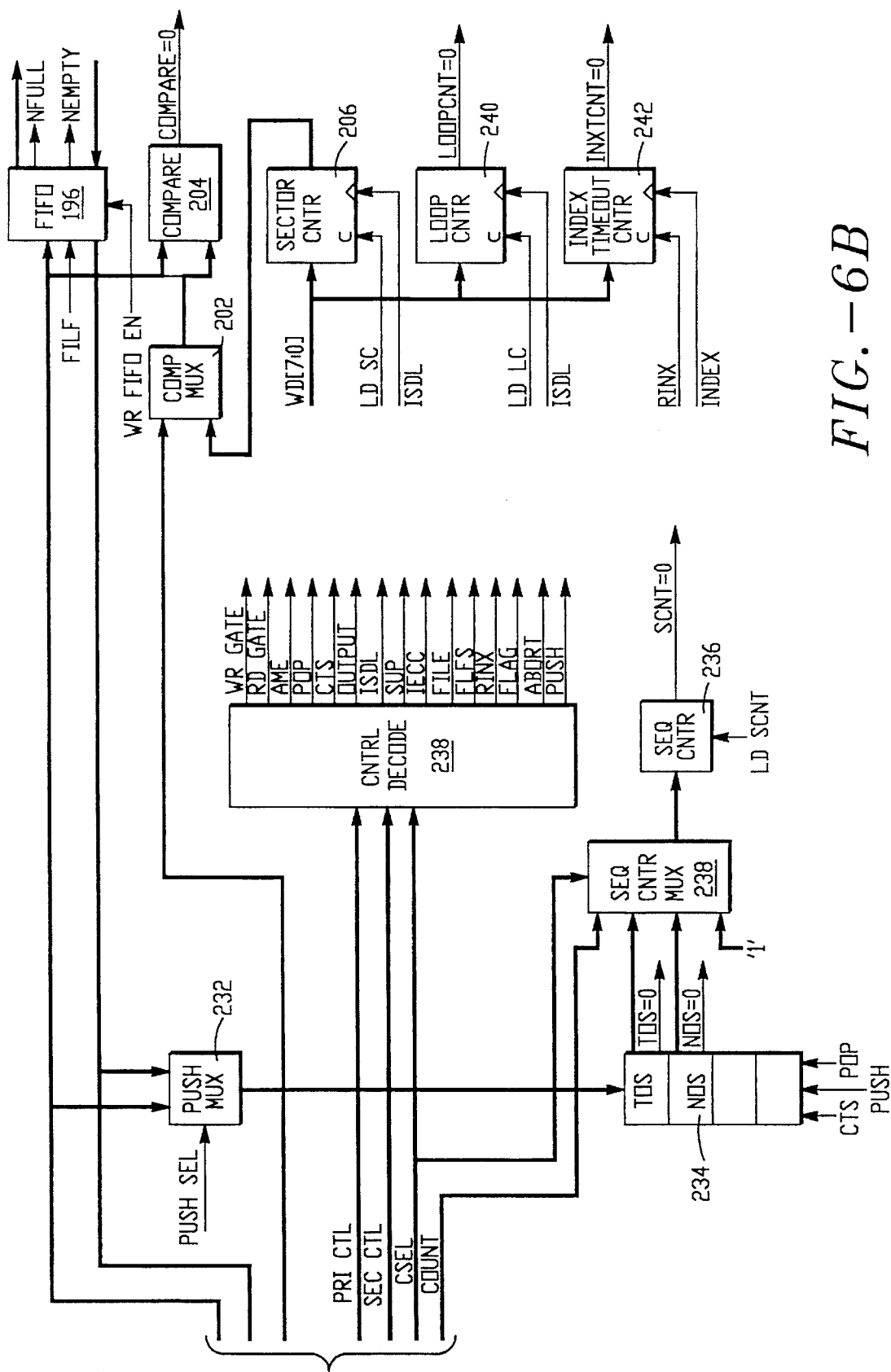

Turning now to FIGS. 6A and 6B, architectural details of the data sequencer 152 are given in greater structural detail. The data sequencer 152 includes an on-the-fly error correction circuit 190 as described in the referenced U.S. patent application Ser. No. 07/650,791. In this regard, it should be noted that the sequencer 152 actually tests the syndrome remainder values supplied from the circuit 190 to see if the values are zero. Each of three data interleaves is tested separately, and the results are latched for each interleave (if non-zero). This approach reduces to one-third the number of gates otherwise required to implement the sequencer's ECC test for zero logic tree.

The data sequencer 152 also includes a data field address mark detector 192 which receives incoming data directly from the circuit 124. The address mark detector 192 looks for a sequence of high frequency flux transitions, and when such is detected, the PLL 134 is then locked onto the sequence and the recovered digital run length encoded data is checked for the presence of the address mark sequence. In this regard, the address mark detector 192 monitors the data stream in order to detect a unique bit sequence which is not consistent with the 1,7 encoding rules and which is predetermined to represent an address mark. The address mark detector 102 is described in greater detail in a commonly assigned, copending U.S. patent application Ser. No. 07/710,065 filed Jun. 4, 1991 and entitled "Fault Tolerant RLL Data Sector Address Mark Decoder", now U.S. Pat. No. 5,231,545, the disclosure thereof being expressly incorporated by reference herein. The address mark detector 102 generates the byte clock signal BYTCLKA from the raw data stream as well as an address mark found (AMFOUND) control signal whenever a bit sequence representing an address mark is found in the raw data stream. The byte clock signal BYTCLKA is defined as the data in clock DIN divided by twelve and synchronized with detection of the address mark by the address mark detector 102.

The 1,7 run length limited encoder/decoder 150 encodes and decodes serial data into and from a 1,7 run length limited (RLL) code, and the serializer/deserializer (SERDES) 194 contained within the circuit 150 but separately shown for clarity in FIG. 6, bundles and unbundles data bytes into and from serial 2 bit-by-2 bit format. A FIFO byte register 196 enables data bytes to be asynchronously transferred between the sequencer 152 and the external cache buffer memory array 166 which is clocked by an external crystal clock standard (as opposed to the BYTCLKA which is synchronized with the raw data stream read back from the disk).

A multiplexer 198 regulates bidirectional data flow through the serializer/deserializer 194 and encoder/decoder 150 so that ECC syndrome bytes generated by the ECC generator 190 may be appended to data blocks flowing to the storage surface of the disk 10, and so that data values present on a writeable control store (WCS) bus 200 may also be sent to the disk for storage.

Reference data sector (i.e. physical sector and transducer head) identification bytes read from data ID fields are passed through a comparison multiplexer 202 to a comparison circuit 204. The comparison circuit 204 compares actual data sector identification bytes received from the SERDES 194 with the reference identification bytes held in a sector counter 206. If a correspondence exists, the desired sector location has been reached, and a Compare=0 control signal is put out by the comparison circuit 204 to a jump control multiplexer circuit 208.

The data sequencer 152 is most preferably implemented as a programmable state machine. Accordingly, a writeable control store (WCS) 210 is provided for containing code words which define progressively the various states of the sequencer 152. The WCS 210 stores sequencer control words which control all of the operational states of the sequencer 152. The WCS 210 may be loaded with information directly written by the microcontroller 162 with data supplied via a microcontroller data register 211 at WCS locations controlled by addresses decoded by a microcontroller address decoder 212.

The WCS 210 accepts control words which are e.g. 28 bits long. Each command line comprises a number of fields. One field is a 5-bit OPCODE field 250, a 2-bit count select field 252, a 3-bit primary control field 254, a 5-bit secondary control field 256, a 5-bit count field 258, and an 8-bit data field 260. Two of the fields, namely the secondary control field 256 and the bit count field 258 are dual purpose. During a count type command, as selected by a 00 value in the count select field 252, the field 256 contains the secondary control, and the field 258 contains a count specified in the command word. During a jump type command, selected by 01, 10 or 11 values in the count select field, the field 256 contains a jump control, and the field 258 contains a jump address. For both types of command words, the opcode, primary control and data fields 250, 254 and 260 are identical.

During one half of the BYTCLKA clock cycle, a multiplexer 214 enables direct access by the microcontroller 162 to the control store 210. During the other half of the BYTCLKA cycle, addresses from a sequence controller 216 are used to address the control store memory area 218. The sequence controller 216 includes a sequence control decoder block 220 which enables the controller 216 to jump to a plurality of predetermined states, a sequence address multiplexer 222 which selects between various possible addresses, a last address register 224 for holding the last sequencer address for application to the control store 210 via the multiplexer 214, and a writeable control store address +1 incrementer 226 which selectively feeds back the next address from the one held in the register 224 to the sequence address multiplexer 222.

The sequence controller 216 is directly controlled by the jump control multiplexer 208 which generates a jump control signal when the value of the count select field 252 indicates a jump type control word. The jump control signal is generated from a plurality of logical inputs to the jump control multiplexer 206 as indicated in FIG. 6A. The 28 bit wide writeable control store (WCS) data bus 200 directly communicates with the writeable control store 210 and enables the values held therein to circulate throughout the sequencer 152 along the paths shown in FIGS. 6A and 6B.

Specifically, an opcode bus 228 leads to an opcode decoder 230 which decodes each five bit opcode from the opcode field 250 into a plurality of logical conditions on the control lines shown coming out of the opcode decoder 230. For example, a PUSH SEL line extends from the opcode decoder to a push multiplexer 232 which enables e.g. data field count bytes C3, C2 and C1 to be pushed directly onto the top of a four byte register stack 234. A top of stack (TOS) bus and a next of stack (NOS) bus connect the stack 234 to a byte sequence counter 236 via a multiplexer 238 which also has the ability to load the sequence counter 236 with "1" values.

The byte sequence counter 236 maintains a present state byte count (remaining bytes within the present state of the sequencer 152). When the presently loaded byte count increments to zero, the end of a particular sequencer state is reached, and the sequence counter 236 puts out a SCNT=0 value to the sequence control decoder 220 so that a next sequencer state may then be invoked.

A control decoder 238 receives primary control values from the primary control field 254 and secondary control values from the secondary control field 256 (during a count type command word as controlled by the count select values from the field 252). The control decoder 238 decodes these values into specific logical control values which are put out over the control lines shown coming out of the decoder 238 in FIG. 6B, including the write gate signal WRGATE and an initialize ECC signal IECC which directly control the ECC syndrome generator 190, for example. Push and pop signals for controlling the stack 234 are also put out from the control decoder 238. The control decoder 238 also puts out write gate and read gate controls. Write gate is used to control data writing to disk operations, whereas read gate is used to lock up the PLL 134 to data during read back operations from the disk.

A loop counter 240 is preset with a number of loops to be made during a particular data block transfer transaction (each loop nominally represents the states required to transfer a data block), and generates a LOOPCNT=0 control value when the count reaches zero. This control value signifying that the required number of data blocks has been transferred is also provided to the jump control multiplexer 208. An index timeout counter 242 keeps track of the beginning of each track by generating an index timeout value INXCNT=0 which is used to control the sequence controller 216. A once per revolution raw index signal stored in the first one of the servo sectors 38 is detected by the servo control circuit 142 and used to clock the index timeout counter 242. Other inputs to the sequence controller 216 are the jump value from the jump control multiplexer 208, the address mark found value AMFOUND from the address mark detector 192, and the byte sequence counter SCNT=0 value from the sequence counter 236.

The WCS 210 also includes a number of path-dedicated registers which lead via paths depicted in FIG. 6 to other elements within the sequencer 152. The following description sets forth a register address, a register name, and a description of the register:

| ADR | NAME | Description |
|---|---|---|
| A0 | WCSOP | WCS Opcode and Count/Jump Select Register |
| | | This register allows the microcontroller 162 to write to and read from the five bit opcode field 250 portion of the register (bits 2–6) leading to the opcode bus 228, and to write to and read from a count/jump select field 252 (bits 0 and 1). |
| A1 | WCSCTL | WCS Control Register |
| | | This register enables the microcontroller 162 to write to and read from the primary control field 254 (bits 5–7) and the secondary control/jump control field 256 of the entry in the WCS 210 which is currently pointed at by the microcontroller WCS pointer register 212 (WCSADD). |
| A2 | WCSJUMP | WCS Jump Address/Count Register |
| | | This register enables the microcontroller 162 to write to and read from the jump address field 256 and count field 258 (bits 0–5) of the entry in the WCS 210 which is currently pointed at by the microcontroller WCS pointer register 212 (WCSADD). |
| A3 | WCSDATA | WCS Window-Data Register 211 |
| | | This register enables the microcontroller 162 to write to and read from the data field of the entry in the WCS 210 which is currently pointed at by the microcontroller's WCS pointer register 212. In addition, writing to this register also causes the sequencer 152 to place this WCS entry (as determined by previous writes to the other three WCS window registers and by the write to this register) into the WCS at the address specified by a register WCSADD, discussed below. While this update may be performed while the sequencer 152 is operating, modifying the WCS entry the sequencer is presently executing may lead to unpredictable results. |
| A4 | WCSADD | Microcontroller WCS Pointer Register 212 |
| | | Bits 0–4 of this register point to the address in the WCS 210 which will be modified by the next write by the microcontroller 162 to the WCS window-data register 211 (WCSDATA). Writing to this pointer register will cause the sequencer 152 to load the four WCS window registers with the current contents of the entry in the WCS pointed at by this register. That entry may then be updated by modifying the corresponding values in the WCS window registers. |
| A5 | SEQADD | Sequencer WCS Pointer Register |
| | | This read-only register enables the microcontroller 162 to read the address of the last WCS entry executed by the sequencer 152. Only bits 0–4 are active. |
| A6 | TOPSTACK | Top of Stack Register of Stack 234 |
| | | When this register is written by the microcontroller 162, the written value will be loaded directly into the top of stack (TOS) of the sequencer stack 234. Writing to this register does not push the value onto the stack 234. Thus, writing a value to this register twice would only affect the top of stack, and not the next of the stack. To program the next of stack (NOS) position, a short sequencer program that performs a push function must be written into the WCS and then executed by the sequencer 152. |
| A7 | SECTNUM | Sector Number Register |
| | | The sector number register enables the microcontroller 162 to load a count value into the sector counter 206, e.g. for use as a source for comparison of ID field bytes, depending upon the sequencer program. This register allows the microcontroller 162 to determine the starting sector of a block transfer without rewriting the writeable control store 210. This register may be incremented by a sequencer program for multiple sector transfers. |
| A8 | LOOPCNT | Loop Count Register |
| | | Bit positions 0–6 of this register enable the micro- |

| ADR | NAME | Description |
|---|---|---|
| | | controller 162 to set the value of the loop counter 240. Modification of the loop counter 240 naturally should occur only when the sequencer 152 is halted or is in a loop count modify sequence. In order to start a loop count modify request, the loop count modify request bit flag of the Sequencer Misc Command Register SEQMISC. Bit 7 of the loop count register is a "modify granted" read-only flag bit. Writing to this bit has no consequence. After the request bit is set, the modify granted bit is monitored. Once the request bit is set, the sequencer 152 will not modify the loop counter 240 until the microcontroller 162 clears the request bit by writing to the SEQMISC register at the request bit position. Thus, so long as the modify granted bit is set, the microcontroller 162 is free to modify the loop counter value without fear of a hardware conflict. The microcontroller 162 must release the "modify granted" state within one data sector time, or the sequencer 152 will lose the count for the second sector, as only one increment is saved. |
| A9 | WUSINXCNT | Write Unsafe Delay & Index Timeout Count Reg. The write unsafe delay (bits 4–7) specifies the amount of time after write-gate is asserted that the write unsafe signal will be ignored. This delay is to allow the write pre-amp to detect the effect of the write data pulses. The delay is measured in byte steps. The index timeout count (bits 0–3) specifies the maximum number of index pulses that may occur while the sequencer 152 is trying to complete its program. If the indicated number of indexes occurs, the sequencer will stop and set the index timeout flag in the sequencer error status register SEQSTAT. Such an occurrence generally indicates that the desired data ID header was not found. |
| AA | RGHIGCNT: | PLL High Gain Time Register. This register controls behavior of the interface between the sequencer 152 and the read channel during reading of data from the disk 10. When commanded into a high gain mode, the PLL 134 within the read channel circuit 124 acquires lockup to incoming data more rapidly. This feature enables shorter ID preamble fields and therefore increases the storage capacity for user data. To set the PLL to a high gain mode, the sequencer 152 pulses a PLLLOW line low (thereby instructing high gain) for a defined amount of time in steps of 8 code clocks (2/3 byte times). This defined time is set into bits 0–3 of this RGHIGCNT register. When RDGATE is de-asserted (at the end of a data readback operation) the PLL 134 must lock back up to the reference clock. PLLLOW is again set to high gain mode at this time also. The read channel circuit 124 must reacquire AGC gain after each servo sector 38, as the particular data zone may not be recorded at the same bit transfer rate as the servo sector 38. While a delay to reacquire AGC gain and then find the two byte high frequency pattern before asserting RDGATE could be built into the data format, the extra delay has been avoided by provision of a post-servo read gate force (PWRGF) feature. If this feature is enabled by setting bit 2 of the SEQCONF register, discussed below, RDGATE is forced on at a particular time interval after the servo sector ends (to allow time for the AGC to settle. The delay specified by the PWRGF wait time is measured in steps of 8 code clocks (2/3 byte times). After the PWRGF delay, set into bit positions 4–7 of this RGHIGCNT register, the search for the data address mark pattern proceeds normally, as if two bytes of high frequency preamble pattern had been found. |
| AB | SEQCMD | Sequencer Command Register This write-only register is written to by the microcontroller 162 to control the sequencer 152. Bit 0: When set, bit 0 starts the sequencer. When cleared, bit 0 stops the sequencer. Bit 1 sets the direction of data flow. When set, data flows from the buffer memory 166 to the disk 10, during a disk data write operation. When cleared, data flows from the disk 10 to the buffer memory 166, during a data readback operation. Bit 2: When set, bit 2 inhibits the sequencer from enabling the buffer memory interface. No bytes will be transferred irrespective of how the writeable control store (WCS) is programmed. Bits 3–7 are currently reserved for future commands. |
| AB | SEQSTAT | Sequencer Status Register This read-only register is read by the microcontroller 162 in order to obtain current status of the sequencer 152. Bit 0: Set whenever the sequencer 152 is running. Bit 1 Indicates direction of sequencer data flow. Bit 2: Status of current command bit: No Buff" Bit 3: Indicates the syndrome latch of the ECC circuit 190 is closed, and contains the syndrome of the last error. Bit 4: Indicates present status of the "trigger in" pin. Bit 5: Indicates status of the sequencer internal flag bit. Bit 6: Asserted when the sequencer loop counter 240 is presently zero. Bit 7: Asserted if the sequencer clock is currently off. |
| AC | SEQINT | Sequencer Interrupt Control/Status Register The bits of this register monitor events in the sequencer 152 and in the buffer controller 154. Each bit is set whenever the signal it monitors is set. The bit will remain set, even if the original signal is cleared, until cleared by the microcontroller 162. Clearing a bit position is accomplished by writing a "1" to the corresponding location in this register. These events may be used to cause an interrupt to the microcontroller 162 over the sequencer interrupt line. Which events will cause interrupts is determined by programming the sequencer interrupt mask register SEQMASK. The bits of this register are as follows: Bit 0: Set when the sequencer halts. Bit 1: Set when the ECC syndrome latch is closed. This normally occurs when the sector just read has a non-zero syndrome (the data is incorrect). The ECC syndrome latch will now contain the syndrome of the sector with the error and will hold this information until the microcontroller 162 opens the syndrome latch. This enables the sequencer 152 to continue to process incoming sectors not having any errors. Bit 2: Set when the sequencer control field commands a microcontroller interrupt. Bit 3: Set when a diagnostic signal selected by a diagnostic muxout function select register is asserted. Bit 4: Set when the sequencer flag bit is set. This bit should not be confused with the flag bit of the sequencer status register SEQSTAT. Bit 5: This bit monitors the host transfer counter within the memory controller 154 and is set whenever the count is exhausted. Thus, this bit is set at the end of each block transferred to the host via the interface. Bit 6: This bit monitors completion of the host channel of the memory controller 154. This bit is set when the host transfer counter is exhausted and the host loop count zero signal is asserted. This signal is asserted whenever the buffer 166 is configured for AT interface or when the IFCTLN signal is asserted when the buffer is configured for SCSI interface. Bit 7: Not currently used. |
| AD | SEQMASK | Sequencer Interrupt Mask Register Setting a bit in this register enables the corresponding event bit in the interrupt status register to cause a sequencer interrupt by asserting the sequencer interrupt pin leading to the microcontroller 162. Bit 0: Not busy Bit 1: ECC Syndrome Latch closed. Bit 2: Sequencer Interrupt. Bit 3: Sequencer Trigger. Bit 4: Sequencer Flag. Bit 5: Host Block done. Bit 6: Host Done. Bit 7: Not used. |
| AE | SEQMISC | Sequencer Miscellaneous Command Register |

| ADR | NAME | Description |
|---|---|---|
| | | Setting a bit in this register (by writing a "1") provides various miscellaneous commands to the sequencer 152.<br>Bit 0: Forces the sequencer to halt. This will force a sequencer interrupt, if enabled.<br>Bit 1: Forces sequencer into the set state.<br>Bit 2: Forces sequencer into the clear state.<br>Bit 3: Shuts down the sequencer section of the circuit 140 to reduce power consumption.<br>Bit 4: Enables the Sequencer section of the circuit 140.<br>Bit 5: Sets loop count modify request bit and starts a loop count modify sequence. See discussion above under Loop Count Register.<br>Bit 6: Clears loop count modify request bit.<br>Bit 7: Forces the ECC syndrome latch open, or into its normally transparent state. |
| AF | SEQERROR | Sequencer Error Status Register<br>This register is used to monitor various error status signals in the sequencer 152. It is usually accessed by the microcontroller 162 after a halt to determine why the sequencer has halted. The bit positions have the following meanings:<br>Bit 0: Set when the data address mark in the data field contains a special data pattern indicating that ECC corrected data has been rewritten, for example.<br>Bit 1. Set when the index timeout counter 242 exceeds the maximum number of indexes allowed for operation. This bit is cleared by any write to the sequencer command register SEQCMD.<br>Bit 2: Set when the sequencer timed-out while searching for a data address mark. The timeout limit is set by the byte count field in the writeable control store (WCS). This bit is cleared by any write to the sequencer command register SEQCMD.<br>Bit 3: Set when the compare latch 204 is not equal to zero. The compare latch 204 is used to correctly identify data ID fields. This bit is cleared when a control word CALLL is written in the WCS.<br>Bit 4: This bit is set to indicate that the last sector read had a syndrome error. Syndrome detection is done on an interleave basis. The bit is usually cleared at the start of a data sector by a control word CALLL written in the WCS. The bit is set if during the last byte of each interleave, that interleave's syndrome remainder is not equal to zero. The ECC circuit 190 is instructed to check the syndrome by the sequencer when it executes the WDS, CRCS or ECCS opcode. If latch syndrome enable is set in the sequencer configuration register (Bit 4 of address WR-AF), the syndrome latch is closed and the offending syndrome remainder is saved when the sequencer executes a JSYN opcode. If the latch syndrome enable bit is not set, or the syndrome latch is already closed, the sequencer 152 is ordinarily programmed to halt.<br>Bit 5: This bit is set when the sequencer was halted because of an external or servo declared write fault. This bit is cleared by any write to the sequencer command register SEQCMD.<br>Bit 6: This bit is set if the FIFO 196 is in an over-ran or under-ran condition when the buffer controller 154 accesses the FIFO. This bit is cleared by any write to the sequencer command register SEQCMD.<br>Bit 7: This bit is set if there was a FIFO overrun or underrun when the sequencer 152 accesses the FIFO 196. This bit is also cleared by any write to the sequencer command register SEQCMD. |
| AF | SEQCONF | Sequencer Configuration Register<br>The bit positions of this register control the operating configuration of the sequencer 152 and are written by the microcontroller 162 during execution of initialization program routines.<br>Bit 0: Not used.<br>Bit 1: When set, this bit causes the sequencer to compute and write a 2 byte error detection code within the data ID field during data formatting which is sufficient for disk drives not employing split data fields. When cleared, this bit causes the sequencer to compute and write the 3 byte error detection code as contemplated in the FIG. 3 split data field format.<br>Bit 2: When set, the sequencer will force RDGATE true after each servo sector 38 has passed by. The assertion of RDGATE will be delayed by the wait time PWRGF contained in the RGHIGCNT register.<br>Bit 3: When set, this bit establishes fault tolerance within the address mark detector 192 as described in the referenced copending U.S. Pat. application Ser. No. 07/710,861, now abandoned. When cleared, the address mark detector 192 will not tolerate e.g. bit shift errors.<br>Bit 4: When set, the sequencer 152 will use the syndrome latch within the ECC circuit 190 and will not halt when a non-zero syndrome remainder is detected, thereby enabling on-the-fly error correction in accordance with the techniques described in copending U.S. Pat. application Ser. No. 07/650,791 filed on February 1, 1991, now U.S. Pat. No. 5,241,546.<br>Bit 5: When set, this bit disables multiplexing between the read rate clock for reads and the reference clock for writes. When cleared, the read reference clock is used for both data reads and writes.<br>Bit 6: Not used.<br>Bit 7: Not used |

The following registers contain non-zero syndrome remainder bytes which are latched by the syndrome latch of the ECC circuit 190. In addition, two cross check bytes are also latched. The cross-check bytes enable the microcontroller 162 to determine the impact of a proposed correction before the correction is actually made to the data block containing the detected error burst or bursts before correction is made.

| ADR | NAME | Description |
|---|---|---|
| B0 | ECC | Latched Syndrome Remainder Interleave 0, Byte 0 |
| B1 | ECC | Latched Syndrome Remainder Interleave 0, Byte 1 |
| B2 | ECC | Latched Syndrome Remainder Interleave 0, Byte 2 |
| B3 | ECC | Latched Syndrome Remainder Interleave 0, Byte 3 |
| B4 | ECC | Latched Syndrome Remainder Interleave 1, Byte 0 |
| B5 | ECC | Latched Syndrome Remainder Interleave 1, Byte 1 |
| B6 | ECC | Latched Syndrome Remainder Interleave 1, Byte 2 |
| B7 | ECC | Latched Syndrome Remainder Interleave 1, Byte 3 |
| B8 | ECC | Latched Syndrome Remainder Interleave 2, Byte 0 |
| B9 | ECC | Latched Syndrome Remainder Interleave 2, Byte 1 |
| BA | ECC | Latched Syndrome Remainder Interleave 2, Byte 2 |
| BB | ECC | Latched Syndrome Remainder Interleave 2, Byte 3 |
| BC | ECC | Latched Cross Check Byte 0 |
| BD | ECC | Latched Cross Check Byte 1 |
| BE | BSTATE | Bytes Per State Register (for test purposes only) |
| BF | LSECT | Latched Sector Number Register<br>This register contains the contents of the sector number register when the ECC syndrome latch was closed. In other words, this register contains the sector number of the particular data block determined by a non-zero syndrome remainder presently held in the ECC syndrome latch to contain an error. This identification enables the microcontroller 162 to locate the particular data block in the buffer memory 166 and to carry out an error correction on-the-fly. |

The following registers are associated with the buffer controller 154 and shed light upon its structure and function.

| | | |
|---|---|---|
| 80 | HARLO | Host Address Register, Low Byte |
| 81 | HARHI | Host Address Register, High Byte |

These two registers contain the address of the next byte in the buffer memory 166 to be transferred to the host computer via the interface 168. The topmost bit of the high byte register is not used, and is read as a zero.

| | | |
|---|---|---|
| 82 | DARLO | Disk Address Register, Low Byte |
| 83 | DARHI | Disk Address Register, High Byte |

These two registers point to the location in the buffer memory 166 of the next byte to be transferred to the disk via the sequencer 162 and the read channel 124. The topmost bit of the high byte register is not used and is read as a zero.

| | | |
|---|---|---|
| 84 | MARLO | Microcontroller Address Register, Low Byte |
| 85 | MARHI | Microcontroller Address Register, High Byte |

These two registers contain an address indicating the next byte that the microcontroller data register will access. The topmost bit of the high byte is not used and is read as a "*".

| | | |
|---|---|---|
| 86 | RLOAD | Reload Register |

The host address registers HARLO and HARHI and the data address registers DARLO and DARHI will be loaded with the address contained in this register when a roll-over occurs. This register follows the same convention as the rollover register (discussed below) in that only bits 6 through 1 are used, all lower bits are treated as zero, and the contents of this register correspond to the high byte of the reload address.

| | | |
|---|---|---|
| 87 | ROLL | Roll-Over Register |

The roll-over register specifies an address which represents the top of a virtual ring buffer defined within the buffer memory 166. The roll-over address comprises bits 6 through 1 of this register, and the 9 lower bits are set to "1". Thus, the roll-over register appears to be the high byte of the roll-over address, but the least significant bit of this byte must be set to "1". When either the disk address registers DAR or the host address registers HAR reach the value contained in the roll-over register, and the roll-over feature is enabled for the host or data channel, as appropriate, the corresponding address register is loaded with the contents of the reload register. Bits 7 and 0 of the roll-over register are not used.

| | | |
|---|---|---|
| 88 | HXCLO | Host Transfer Counter, Low Byte |
| 89 | HXCHI | Host Transfer Counter, High Byte |

These two registers together comprise a loadable counter containing the number of bytes to be transferred per block. Loading a value of "1" will cause two bytes to be transferred. After reaching zero, this counter will automatically reload to the value initially loaded. When this happens, the transfer will be halted if the loop count zero signal is asserted. This host transfer counter is typically preloaded with a value of 511, denoting transfer of 512 byte blocks, and is preloaded when the auto-write signal is asserted. The auto-write signal only preloads this counter and does not affect the reload value.

| | | |
|---|---|---|
| 8A | AUTOWR | Auto-Write Preload Register |

This register contains the value to preload into the host address registers in event of an auto-write. This register only uses bits 6 through 1, but it is adjusted to correspond with the high byte of the host address register HARHI. Because of this, bits 0 and 7 of HARHI are always preloaded to zero. This restricts preload boundaries to 512 byte boundaries in the buffer memory 166. For example, loading this register with 34H causes the first byte of a block to be loaded into the buffer memory after an auto-write to be placed at 3400H, the next byte at 3401H, etc.

| | | |
|---|---|---|
| 8C | MDR0 | Microcontroller Data Register |

When the microcontroller 162 writes to this register, the byte written will be transferred to the buffer memory 166 at the address specified by the microcontroller address register. Accessing this register, either reading or writing, or either byte position of the microcontroller address registers will cause the buffer controller 154 to prefetch the buffer memory byte at the location identified by the microcontroller address register and store the fetched value in this register. Accessing the microcontroller data register will not automatically increment the microcontroller address register. This register is used to fetch and replace an erroneous byte as a consequence of the ECC operation carried out by the microcontroller 162 and the circuit 190, for example.

| | | |
|---|---|---|
| 8D | MDR1 | Microcontroller Data Register with Automatic Increment |

Writing this register will deposit the byte so written in the buffer memory 166 at the address specified by the microcontroller address register. Accessing this register, whether reading or writing, or either byte of the microcontroller register will automatically cause the buffer controller 154 to prefetch the byte from the buffer memory 166 specified by the address contained in the microcontroller address register. Also, accessing this register will cause the microcontroller address register automatically to increment to the next byte address.

| | | |
|---|---|---|
| 8E | BCTL | Buffer Controller Control Register |

This register contains control bits for controlling operation of the buffer controller 154. The bits are:
Bit 0: Enables the data path between the buffer memory 166 and the disk 10.
Bit 1: Enables the data path between the buffer memory 166 and the host via the interface 168.
Bit 2: Indicates the direction of data flowing from the hostbuffer channel. When set, indicates that data is flowing from the host into the buffer 166.
Bit 3: When set enables rollover (and configures a virtual ring buffer in the buffer memory 166)
Bits 4–7: Not used.

| | | |
|---|---|---|
| BF | BCFG | Buffer Controller Configuration Register. |

This register enables the microcontroller program to configure the memory buffer controller 154.
Bit 0: Enables the auto-write feature.
Bit 1: When asserted, specifies an IBM AT ™ type interface configuration at the interface 168.
Bit 2: When asserted, enables the buffer memory 166.
There are several other registers contained within the circuit 140, and they are now briefly discussed.

| | | |
|---|---|---|
| E0 | MAP | Microcontroller Memory Address Map Register |

Bits 0–2: Controls the mapping of the microcontroller address space C000H-DFFFH into address space for the program memory 178. These three bits control the most significant three bits of the mapped address. Thus, writing "010" to these bits will map the microcontroller address C000H-DFFFH into the address range 4000H-5FFFH.
Bit 3: Writing a "1" to this bit position will cause a soft power on reset sequence to occur within the circuit 140. The power on reset condition will remain until a "0" is written to this bit position.
Bits 4–5: This two-bit field is used to reset the hardware counters that divide down the clocks for the microcontroller 162 and the interface circuit 168. The reset is caused by writing an "01" pattern to this field. These time base counters will remain reset until the field is rewritten with a different pattern. Of course, writing an "01" pattern to this field will stop clocking at the microcontroller 162 and it will not be able to rewrite this field.
Bit 6: The microcontroller write strobe MWRN is normally narrowed to make data on the microcontroller bus 160 stable over both edges of the internal write strobe. When this bit is set, this narrowing is bypassed and the full MWRN strobe is used.

| | | |
|---|---|---|
| E1 | CRR | Clock Rate Register |

In order for the disk drive 100 to employ a single quartz crystal time standard, the circuit 140 generates a clock to operate the microcontroller 162 and another clock to run the interface circuit 168. This register controls the divider constant between the crystal frequency and the output clocks. The UPSEL field (bits 4–5) controls the microcontroller clock rate (16, 8, 4, 1 MHz), and the IFPSEL field (bits 0–1) controls the present interface clock rate as 8, 6, 4, 0 MHz. To support power down options, an IFNSEL field (bits 2–3) has been included to control interface clocking rate after an auto-write as 8, 16, 4 or 0 MHz. This arrangement allows the interface circuit 168 to power down to a slow speed and still respond at the required rate to a write command over e.g. a bus such as the AT bus. Bit 6, when set, enables switching the interface clock rate to the rate determined by IFNSEL when an autowrite occurs.

F0 MUXSELOUT Test Pin MUXOUT Function Select
This register controls the function of a diagnostic pin MUXOUT of the circuit 140. The pin can be configured as an input, enabling the sequencer 152 to monitor an external signal. The pin can be configured as an output, enabling external hardware to monitor internal signals within the circuit 140. The functions are:
Bit 0: Trigger input to the sequencer.
Bits 1-3 Not currently used.
Bit 4: The pin puts out the index signal. This signal is asserted when detected within the index servo sector and is deasserted at the beginning of the next servo sector.
Bit 5: The pin puts out a true level during the time of each servo sector 38.
Bit 6: The pin puts out the trigger signal from the sequencer 152.
Bit 7: The pin puts out the commute input signal divided by 12 from the spindle motor control circuit 107.

F1 MTRCONF Spindle Motor Configuration Register
This register controls configuration of the spindle motor control circuit 156.
Bit 0: This bit must be set in order for the motor index timer to run. The counter will be held reset if this bit is cleared.
Bit 1: This bit enables the divide by 12 prescaler that scales the commute signal before it is compared against the index period counter 242. When this bit is set, the commute pin is divided by 12.
Bit 2: When this bit is set, the tachometer signal (COMUTE if 'Div 12' = 0, or COMUTE/12 if 'Div 12' = 1) is OR'd with the SRVINT signal pin. When this bit is clear, the pin is initially under the control of the servo control circuit 142.
Bits 3-4: This field controls the width of the fixed period of pump-down that the motor control puts out once per revolution of the disk 10, as 32, 64, 128 or 256 clock periods.
Bit 5: Writing a "1" to this bit position puts the index period counter 242 into a test mode.
Bit 6: When this bit is set, the index period counter 242 runs off of the crystal clock at e.g. 32 MHz. Otherwise, it runs off the Fxtal/16 or 2 MHz.
Bit 7: This read only bit position puts out the state of the index period comparator F2 MTRCNTLO Spindle Motor Count, Low Byte
F3 MTRCNTHI Spindle Motor Count, High Byte
This two byte register contains bits 0–15 of the spindle motor count.

The following table sets forth a description of the various signal lines shown entering and leaving the integrated circuit 140 in FIG. 5:

| NAME | TYPE | DESCRIPTION |
| --- | --- | --- |
| WRGATN | Out | Write gate out to pulse detector 126 and preamp 120. |
| WRUNSF | In | Write unsafe condition flag. |
| MUXOUT | Bi-Dir | Multiplexed test signal |
| PLLLOW | Out | Low Gain command for PLL 134 |
| RDGATE | Out | Read Gate to PLL 134 |
| RRC | IN | Read reference clock from PLL 134 |
| RDDATA | IN | Synchronized read in data from PLL 134 |
| WRDATA | OUT | RZ write data to pre-comp circuit in pulse detector 126 |
| REFCLK | IN | Input from VCO of synthesizer 136 which is used during data writes to disk. |
| EARLY | OUT | Early precomp code to pre-comp circuit in pulse detector 126. |
| LATE | OUT | Late precomp code to pre-comp circuit in pulse detector 126. |
| RAWDAT | IN | Disk raw data read in from pulse detector 126. |
| S[3:1] | Out | S[3:1] control lines for peak detector 132. |
| AGCHLD | Out | AGC hold current gain level control for AGC circuit 128. |
| DISPD | Out | Discharge servo peak detectors in peak detector circuit 132. |
| BSTRDY | Out | Burst Ready--starts analog to digital conversion process at a/d 182. |
| VCOFST | Out | Control from synthesizer control to cause synthesizer 136 to increase its frequency. |
| VCM1 | Out | DAC output for PWM 144 data value "1" weighting value. |
| VCM32 | Out | DAC output for PWM 144 data value "32" weighting value. |
| PORN | In | Power-on reset signal. |
| MAD [15:13] | In | Address bits 15, 14 and 13 for bus 174 |
| MBUS[7:0] | Bi-Dir | Data bits 0–7 of bus 160. |
| MRDN | In | Read strobe for bus 160. |
| MWRN | In | Write strobe for bus 160. |
| MALE | In | Bus 160 address latch enable. |
| SEQINT | Out | Interrupt from sequencer 152 to microcontroller 162. |
| SRVINT | Out | Interrupt from servo circuit 142 to microcontroller 162. |
| LA[15:13] | Out | Latched address output bits 15, 14 and 13 to ROM 156 over bus 180. |
| LA[7:0] | Out | Latched address output bits 7–0 to ROM 156 over bus 180 |
| ROMCSN | Out | Chip select for ROM 178. |
| INFCS | Out | Interface circuit 168 chip select. |
| MTRUP | Out | Spindle motor accelerate up command from motor controller 156 to driver 107. |
| MTRDN | Out | Motor decelerate down command from motor controller 156 to driver 107. |
| COMUTE | In | Commutation signal from driver 107. |
| INFCTL | In | Interface control from interface circuit 168 (loop count zero, or autowrite) |
| REQN | In | Request for data bytes from interface circuit 168. |
| Ackn | Out | Acknowledge receipt of bytes from interface circuit 168. |
| BDT[7:0] | Bi-Dir | Buffer memory data bus 164 to buffer memory 166. |
| BAD[14:0] | Out | Buffer address bus 172 from memory controller 154 to buffer memory 166. |
| CSN | Out | Buffer memory chip select control line. |
| CEN | Out | Buffer memory 166 output enable line. |
| WRN | Out | Buffer memory 166 write enable line. |
| XTLIN | In | 32 MHz crystal Oscillator input. |
| XTLOUT | Out | 32 MHz crystal oscillator output from internal clock within circuit 140. |
| UPCLK | Out | Clock signal to microcontroller 162 (16 MHz nominal). |
| IFCLK | Out | Clock signal to interface circuit 168 (16 MHz or 8 MHz nominal). |

The following table sets forth count type commands which may be included in the primary control field 254 and secondary control field 256 and which are executed by the sequencer 152:

| | | | COUNT-TYPE COMMANDS |
| --- | --- | --- | --- |
| 00 | 000 | NOP | No operation |
| 00 | 001 | CWR | Clear write gate, read gate |
| 00 | 010 | CWRE | Clear write gate, read gate, ECC |
| 00 | 011 | CALLL | Clear write gate, read gate, initializes ECC to some known value, clears syndrome and compare latches. |
| 00 | 100 | SUP | Set microcontroller interrupt bit |
| 00 | 101 | SOU | Set output to "1" |
| 00 | 110 | ISDL | Increments sector number, decrements loop counter. |
| 00 | 111 | SWG | Turns on write gate. |
| 01 | 000 | IECC | Sets ECC/CRC to Initial state. |
| 01 | 001 | CCS | Clears Compare and syndrome flip-flops |
| 01 | 010 | CTS | Loads "0" into top of stack of stack 234 |
| 01 | 011 | POP | POP stack 234, filling top of stack with "0". |

-continued

COUNT-TYPE COMMANDS

| 01 | 100 | PUSH | Value in buffer pushed onto stack 234. |
| 01 | 101 | RINX | Restart Index Timeout counter 242 |
| 01 | 110 | EAB | Enable abort; operation may abort by microcontroller command or buffer error. |
| 01 | 111 | DAB | Disable abort |
| 10 | 000 | SRG | Set read gate |
| 10 | 001 | SERS | Clears Write Date Out. |
| 10 | 010 | CERS | Normal Write Data Out. |
| 10 | 011 | COU | Clear output to "0". |
| 10 | 100 | SFLG | Set flag |
| 10 | 101 | CFLG | Clear Flag |
| 10 | 110 | CRG | Clear read gate |
| 10 | 111 | FILF | Prefill of buffer FIFO 196 is enabled. |
| 11 | 000 | FLSF | Any remaining data in FIFO is flushed. |

The following table sets forth jump-type commands as indicated when a value other than "00" is present in the count select field 252. These commands are placed in the jump control field 256 and executed by the sequencer 152:

JUMP-TYPE COMMANDS

| 0 | XXXX | Jump if true | |
| 1 | XXXX | Jump if false | |
| X | 0000 | JMP | Jump Always; jump may be to next instruction for NOOP, or inverter for jump never. |
| X | 0001 | JTOS | Jump if Top of stack = 0 |
| X | 0010 | JNOS | Jump if Next of stack = 0 |
| X | 0011 | JLC | Jump if Loop count = 0 (operation complete) |
| X | 0100 | JSYN | Jump if ECC Syndrome flip-flop is clear |
| X | 0101 | JSC | Jump if both ECC Syndrome and Compare flip-flops are clear. |
| X | 0110 | JSCT | Jump if (syndrome = 0 and compare = 0 and top of stack <>0) |
| X | 0111 | JSCA | Jump if (syndrome = 0 and compare = 0 and special data address mark = 0). |
| X | 1000 | JFLG | Jump if Flag = 0 |
| X | 1001 | JA | Jump if special address mark bit is clear. |
| X | 1010 | JCMP | Jump if compare flip-flop = 0. |
| X | 1011 | JWDG | Jump if Servo (wedge) = 1 |
| X | 1100 | JINP | Jump on rising edge of input. |
| X | 1101 | JINX | Jump on rising edge of index. |
| X | 111X | Reserved | |
| | | | These commands are placed in the primary control field 254 and the count select field 252 is set to jump ("00"). |
| 00 | 000 | NOP | |
| 00 | 001 | CWR | Clear write gate, read gate, AME. |
| 00 | 010 | CWRE | Clear write gate, read gate, and initializes ECC to some known value. |
| 00 | 011 | CALLL | Clear write gate, read gate, AME, sets ECC to some known value, clears syndrome and compare latches. |
| 00 | 100 | SUP | Set microcontroller interrupt bit. |
| 00 | 101 | SOU | Set output to 1. |
| 00 | 110 | ISDL | Increments Sector number, Decrements Loop counter. |
| 00 | 111 | SWG | Turns on write gate. |

As an aspect of the present invention the sequencer 152 may be programmed such that it need not be reprogrammed between read and write, thereby considerably speeding up its overall operational data block throughput. Accordingly, the following opcodes apply when the write gate is set, meaning that a write of one or more data blocks will be made to the data surface. Write gate set during a data ID header 42 indicates that a data format operation is being performed. These opcodes are used when the sequencer 152 is causing data to be written to the disk 10.

OPCODES-WRITE GATE SET

| 0 | AMIST | AME ID Search, Timeout; Write ID field address mark, set to two byte CRC mode. |
| 1 | AMDST | AME Data Search, Timeout, Write data field address mark, set to 3 byte EDC mode. |
| 2 | AMIIT | AME ID Immediate, Timeout; Write ID field address mark, set to CRC mode. |
| 3 | AMDIT | AME Data Immediate, timeout; Write Data field address mark, set to ECC mode. |
| 4 | AMIS | AME ID Search; Write ID field address mark, set to CRC mode. |
| 5 | AMDS | AME Data Search; Write Data Field address mark, set to ECC mode. |
| 6 | AMII | AME ID Immediate; Write ID field address mark, set to CRC mode. |
| 7 | AMDI | AME Data Immediate; Write data field address mark, set to ECC mode. |
| 8 | WD | WCS Data; Data from the writeable control store is written to disk, data is not included within ECC/CRC. |
| 9 | WDE | WCS Data with ECC/CRC; Data from WCS is written to disk; data is included with ECC/CRC. |
| 10 | WDC | WCS Data with compare; Same as WD. |
| 11 | WDEC | WCS Data with compare and ECC/CRC. Same as WDE |
| 12 | WD1R | WCS Data, 1 count if read; Same as WCS data (force 1 count if write gate = 0). |
| 14 | WDS | WCS Data with Syndrome Check; Same as WCS data. |
| 16 | BD | Buffer Data; Data from buffer 154 is written to disk, not included in ECC/CRC. Does not generate FIFO request for last byte. |
| 17 | BDE | Buffer Data with ECC/CRC. Data from buffer is written to disk. Does not generate FIFO request for last byte. |
| 18 | BTS | Buffer to Top of Stack; Data from buffer 154 is written to top of stack 234 and to disk. Does not generate FIFO request for last byte. |
| 19 | BTSE | Buffer to Top of Stack with ECC/CRC; Data from buffer 154 is written to top of stack 234. Data is included within ECC/CRC. Does not generate FIFO request for last byte. |
| 20 | BDX | Buffer data with extra byte; Data from the buffer 154 is written to disk. Not included within ECC/CRC. Generates a FIFO request for the last byte. |
| 21 | BDEX | Buffer data with ECC/CRC with extra byte; data from the buffer 154 is written to disk. Data is included within ECC/CRC. Generates a FIFO request from the last byte. |
| 22 | BTSX | Buffer to Top of Stack with Extra Byte; Data from the buffer 154 is written to top of stack 234 and to disk. Generates a FIFO request from the last byte. |
| 23 | BTSEX | Buffer to Top of Stack with ECC/CRC and Extra Byte; Data from the buffer is written to the top of the stack 234 and to the disk. The data is included within ECC/CRC. A FIFO request is generated for the last byte. |
| 24 | TSD | Top of Stack Data; Not used. |
| 25 | TSDE | Top of Stack Data with ECC/CRC; Not used. |
| 26 | SEC | Sector; data from Sector written to disk. |
| 27 | SECE | Sector with ECC/CRC; data from sector written to disk and includes ECC/CRC. |
| 28 | ECC | ECC; "0"s shifted into the syndrome shift register, ECC written to disk; only used for data. |
| 29 | CRC | CRC or Cross Check. "0"s shifted into syndrome. CRC written to disk if ID, crosscheck written to disk. |
| 30 | ECCS | ECC with syndrome check; Same as ECC. |
| 31 | CRCS | CRC or Cross Check with syndrome check. Same as CRC. |

The following opcodes are executed by the sequencer 152 when the write gate is cleared, i.e. during data readback from the disk. While the same opcodes are used, they have different functions during readback from disk than during write to disk.

| | | OPCODES-WRITE GATE CLEARED |
|---|---|---|
| 0 | AMIST | AME ID Search, Timeout; look for ID field AM in search mode, use bps counter for timeout. |
| 1 | AMDST | AME Data Search, Timeout; look for data field AM in search mode, use bps counter for timeout. |
| 2 | AMIIT | AME ID Immediate, Timeout; look for ID field AM in immediate mode, use bps counter for timeout. |
| 3 | AMDIT | AME Data Immediate, Timeout; look for data field AM in immediate mode; use bps counter for timeout. |
| 4 | AMIS | AME ID Search; look for ID field AM in search mode, no timeout. |
| 5 | AMDS | AME Data Search; look for data field AM in search mode, no timeout. |
| 6 | AMII | AME ID Immediate; look for ID field AM in immediate mode, no timeout. |
| 7 | AMDI | AME Data Immediate; look for data field AM in immediate mode, no timeout. |
| 8 | WD | WCS Data; NOP, data in the WCS data field 260 is put into SERDES 194 so it may be pushed onto stack. |
| 9 | WDE | WCS Data with ECC/CRC; Data from disk 10 used in ECC/CRC calculation. |
| 10 | WDC | WCS Data with Compare; Data from WCS is compared with read data, no ECC/CRC. |
| 11 | WDEC | WCS Data with Compare and ECC/CRC; disk data is compared with WCS data and used in ECC/CRC. |
| 12 | WD1R | WCS Data 1 count if read; Same as WCS Data but forces count to 1. |
| 14 | WDS | WCS data with Syndrome Check; looks at the syndrome, normally one byte state after the ECC state. |
| 16 | BD | Buffer Data; Data from disk is sent to the buffer memory 166, not included in ECC/CRC. |
| 17 | BDE | Buffer Data with ECC/CRC; data from disk is written to the buffer, included within ECC/CRC. |
| 18 | BTS | Buffer Data to Top of Stack; not used. |
| 19 | BTSE | Buffer Data to Top of Stack with ECC/CRC; not used. |
| 20 | BDX | Buffer Data to Top of Stack with extra byte; same as BD. |
| 21 | BDEX | Buffer Data with ECC/CRC with extra byte; same as BDE. |
| 22 | BTSX | Buffer Data to Top of Stack with Extra Byte; not used. |
| 23 | BTSEX | Buffer Data to Top Of Stack with ECC/CRC and Extra Byte; not used. |
| 24 | TSD | Top of Stack Data; Disk Read data pushed onto stack 234. |
| 25 | TSDE | Top of Stack with ECC/CRC; disk read data pushed on stack, included within ECC/CRC. |
| 26 | SEC | Sector; data from sector register compared with data read from disk. |
| 27 | SECE | Sector with ECC/CRC; data from sector register compared with data read from disk, included within ECC/CRC. |
| 28 | ECC | ECC; ECC read from disk. |
| 29 | CRC | CRC or Cross Check; CRC read from disk if ID field, Cross check read from disk if Data field. |
| 30 | ECCS | ECC with syndrome check; ECC read from disk, check the syndrome, normally this is the last two bytes of ECC. |
| 31 | CRCS | CRC or Cross Check; CRC read from disk, check the syndrome, normally this is the last two bytes of CRC. |

The following command line sequence example illustrates operation of the drive 100 with split data fields, for both data block writing and data block reading operations without reprogramming the WCS 210. The writeable control store 210 has its random access memory area written with a sequence such as is exemplified by the following example, and the jump control multiplexer 208, and the sequence controller 216 cause each instruction word to be loaded and executed on a control word by control word basis. Importantly, there is no need to reload the WCS for either a split data field, or when switching from reading to writing. The state of the write gate controls whether reading or writing will be accomplished.

READ-WRITE WITH SPLIT DATA FIELDS

| ADR | 250 OP | 252 CNT | 254 CTRL | 256 JP/CTRL | 258 ADD/CTRL | 260 DATA | DESCRIPTION |
|---|---|---|---|---|---|---|---|
| 0 | AMIS | WCT | CALLL | EAB | 0 | — | ID AM, abort ena. |
| 1 | TSDE | WCT | NOP | CTS | 2 | — | Fill count stack |
| 2 | SECE | WCT | NOP | NOP | 0 | — | Compare sector |
| 3 | WDEC | WCT | NOP | NOP | 0 | | head compare head |
| 4 | CRC | WCT | NOP | NOP | 0 | — | Do EDC, syndrome not ready yet. |
| 5 | CRCS | WCT | NOP | NOP | 1 | — | Do EDC, set synd address register |
| 6 | WDS | CT1 | CWRE | +JSCT | 12 | — | Start Sync immed. |
| 7 | WD | CT1 | NOP | –JSC | 0 | — | look for next ID |
| 8 | WD1R | WCT | NOP | POP | 1 | PAD | PAD-POP stack |
| 9 | WD | CT1 | CWR | –JWDG | 9 | — | Wait for servo sector 38 |
| 10 | WD | CT1 | SWG | JWDG | 10 | SYNC | Preload encoder |
| 11 | WD | WCT | NOP | NOP | 1 | SYNC | AGC rcovry after servo sector 38 |
| 12 | WD1R | WCT | SWG | DAB | 7 | SYNC | Sync Field (no abort) |
| 13 | WD | WCT | NOP | SRG | 0 | 71H | First half of AM (for write) |
| 14 | AMDIT | WCT | NOP | FFFL | 12 | A3H | Second half of Am |
| 15 | BDE | TSCT | NOP | –JNOS | 8 | — | Actual data |
| 16 | CRC | WCT | NOP | NOP | 1 | — | Cross Check |
| 17 | ECC | WCT | NOP | NOP | 9 | — | ECC |
| 18 | ECCS | WCT | NOP | NOP | 1 | — | ECC check 1st w/o interleaves |
| 19 | WDS | CT1 | SUP | –JSCA | 31 | PAD | Bad syndrome? AM? Special AM? |
| 20 | WD | CT1 | ISDL | –JLC | 0 | PAD | Done? |
| 21 | WD | 1CT | CWR | +JMP | 31 | — | Done! |

Another command line sequence example below illustrates a disk-data-format operation with split data fields. In this example the buffer contains the counts, head and sector numbers to be written to the disk 10 and also a 1-byte non-zero number if a wait-for-sector is not to be done before the next ID. The last one of these must be zero.

| 0 | WD | CT1 | CALLL | –JINX | 0 | — | Wait for beginning index. |
|---|---|---|---|---|---|---|---|
| 1 | WD | CT1 | CWR | –JWDG | 1 | — | Wait for servo sector before ID |
| 2 | WD | CT1 | SWG | JWDG | 2 | SYNC | Preload. |
| 3 | WD | WCT | NOP | ENAB | 0 | SYNC | Sync Field (enable abort) |
| 4 | WD | CT1 | NOP | JMP | 6 | SYNC | Jump over write/read recovery. |
| 5 | WD | WCT | NOP | NOP | 0 | PAD | Write to read recovery if no servo sector before ID. |
| 6 | WD | WCT | NOP | IECC | 8 | SYNC | Sync field. |
| 7 | WD | WCT | NOP | CTS | 0 | 71H | First byte of AM. |
| 8 | AMIS | WCT | NOP | FFFL | 0 | E8H | ID address mark |
| 9 | BTSEX | WCT | NOP | NOP | 2 | — | Fill count stack from buffer and write it. Fetch byte for next state |
| 10 | BDEX | WCT | NOP | NOP | 2 | — | Write Head, Sector, Fetch Extra Byte to mark wait for servo wedge before ID |
| 11 | CRC | WCT | NOP | NOP | 2 | PAD | Write EDC/CRC (never check syndrome) |
| 12 | WD | WCT | NCP | NOP | 0 | PAD | Extra pad byte. |
| 13 | WD | CT1 | NOP | –JTS | 17 | PAD | Start Sync immed. |
| 14 | WD | CT1 | CWR | –JWDG | 14 | — | Wait for servo |
| 15 | WD | CT1 | SWR | +JWDG | 15 | PAD | Preload, wait for servo sector end. |
| 16 | WD | WCT | NOP | POP | 1 | PAD | AGC recovery field. |
| 17 | WD | WCT | NOP | NOP | 12 | PAD | SYNC + AM + PAD counts. |
| 18 | WD | TSCT | NOP | –JNS | 14 | PAD | Actual Data field. |
| 19 | WD | WCT | NOP | PUSH | 12 | PAD | Write ECC syndrome remainder bytes. |
| 20 | WD | CT1 | ISDL | –JTS | 5 | PAD | Go to write/read recovery field, no servo before ID. |
| 21 | WD | CT1 | CWR | –JLC | 1 | — | Done? |
| 22 | WD | CT1 | NOP | +JMP | 31 | — | Done! |

The microfiche appendix accompanying the parent U.S. patent application Ser. No. 07/710,861, now abandoned, sets forth in greater detail electrical circuit schematics for the sequencer circuit 152 and also control program routines for execution by the microcontroller 162.

To those skilled in the art, many changes and modifications will be readily apparent from consideration of the foregoing description of a preferred embodiment without departure from the spirit of the present invention, the scope thereof being more particularly pointed out by the following claims. The descriptions herein and the disclosures hereof are by way of illustration only and should not be construed as limiting the scope of the present invention which is more particularly pointed out by the following claims.

What is claimed is: U.S. patent application Ser. No. 07/710,861, now abandoned.

1. A programmable data sequencer within a disk drive including a rotating data storage disk defining a multiplicity of concentric data tracks, at least one of said data tracks including a sequence of fixed capacity data fields which are split into fractional field segments by intervening embedded servo sectors, each one of said data fields being preceded by a data field identification header including plural user byte count values, each one of the plurality of user byte count values indicating a user byte count storage capacity of a corresponding fractional field segment, the disk drive further including a data transducer controllably positioned by a servo head position control loop using information from the embedded servo sectors to pass over said at least one of said data tracks for reading a data field identification header and data field segments of each data field, and a buffer memory means for temporarily storing a fixed length user data block read from or written to the user data field; the programmable data sequencer connected to a read channel including the data transducer and to the buffer memory means, and comprising:

control means for controlling transfer of a user data block between the buffer memory means of said disk drive and the segments of the data field and including a loadable byte sequence counter means for receiving and counting a present user byte count value as the data transducer passes over a corresponding contiguous segment, stack memory means for receiving from the read channel and for holding each user byte count value associated with the corresponding contiguous segment so that the storage capacity of user bytes of said segment is determined directly by said sequencer from said user byte count value, and stack memory control means for pushing each user byte count value being received from the read channel onto the stack memory means as the data transducer passes over the data field identification header, and for popping each user byte count value from the stack memory means to the loadable byte sequence counter means as the data transducer approaches the corresponding contiguous segment.

2. The programmable data sequencer set forth in claim 1 wherein said control means comprises:

writeable control store means including random access memory means directly addressable by a programmed digital microcontroller means of said disk drive for writing sequences of control patterns, there being dual function control patterns such that a single sequence of control patterns may be written for controlling states of said programmable data sequencer during both data read operations and data write operations to and from the rotating data storage disk and the buffer memory means, and control pattern decoding means for decoding the control patterns into functional values for controlling operations within the programmable data sequencer.

3. The programmable data sequencer set forth in claim 2 wherein the control patterns include an opcode field control pattern, a count select field control pattern, a control field control pattern, a jump field control pattern, a count field control pattern, and a data field control pattern, and wherein the control pattern decoding means includes:
opcode decoding means for decoding values comprising an opcode of a control pattern sequence,
jump field decoding means for decoding values comprising a jump field control pattern of said sequence,
control field decoding means for decoding the control field control pattern of said sequence,
counting means responsive to said count field control pattern of said sequence,
data decoding means responsive to said data field control pattern of said sequence,
the count select field pattern for controlling selection between a command operational mode and a jump operational mode for said sequence.

4. The programmable data sequencer set forth in claim 3 wherein at least one control pattern sequence includes a dual purpose control pattern whose purpose is selected by the count select field pattern.

5. The programmable data sequencer set forth in claim 4 including structure responsive to at least two types of control sequences, both types including opcode, data and primary control fields, one type being where a count is required and including a secondary control word field and a count field, and another type being where a jump is required and having a count field of either a one, a top of stack value, and a next of stack value; a jump field and a jump address field.

6. The programmable data sequencer set forth in claim 5 wherein the jump field occupies a same space in the writeable control store means as occupied by the secondary control word field, and wherein the jump address field occupies a same space in the writeable control store means as occupied by the count field, and wherein the structure uses the count select field pattern to determine one of the at least two types of control sequence.

7. The programmable data sequencer set forth in claim 1 wherein said control means comprises:

writeable control store means including random access memory means directly addressable by a programmed digital microcontroller means of said disk drive for writing sequences of control patterns, there being a single sequence written for controlling states of said programmable data sequencer during data read and data write operations to and from the data storage disk and the buffer memory means, the control patterns including an opcode field control pattern, a count select field control pattern, a control field control pattern, a jump field control pattern, a count field control pattern, and a data field control pattern, opcode decoding means for decoding values comprising an opcode of a sequence, jump field decoding means for decoding values comprising at least one of a count select field control pattern and a jump field control pattern, control field decoding means for decoding the control field control pattern, counting means responsive to said count field control pattern, and data decoding means responsive to said data field control pattern.

8. The programmable data sequencer set forth in claim 1 wherein the embedded servo sectors comprise a series of circumferentially spaced apart, radially extending servo sectors, each servo sector being prerecorded with flux transition patterns defining a servo address mark, a servo sector identification number and servo centerline information, the flux transition patterns defining the servo sector identification number and the servo centerline information being converted by the disk drive into digital numbers representing head position relative to one of said concentric data tracks containing said servo sector, said concentric data tracks being grouped into a plurality of concentric track zones, each zone having a user data transfer rate related to radial offset of said zone from a center of rotation of the data storage disk.

9. The programmable data sequencer set forth in claim 1 wherein said disk drive includes a programmed microcontroller means for controlling said programmable data sequencer and said buffer memory means and wherein the control means includes a loadable sector counter means which is directly loadable by the programmed microcontroller means of said disk drive and wherein the sector counter means is responsive to a data clock means for counting a preset number of data bytes comprising a data field.

10. The programmable data sequencer set forth in claim 2 wherein the disk drive includes a programmed microcontroller means for controlling said programmable data sequencer and said buffer memory means and wherein the control means includes loadable loop counter means directly loadable by said programmed microcontroller means and responsive to a data clock means for counting a present number of data byte clock periods corresponding to a loop established within sequences of said control patterns.

11. The programmable data sequencer set forth in claim 2 wherein the disk drive includes a programmed microcontroller means for controlling said programmable data sequencer and said buffer memory means and further comprising loadable sector counter means directly loadable by said programmed microcontroller means and responsive to a data clock means for counting a preset number of data bytes comprising a data field, and loadable loop counter means directly loadable by said programmed microcontroller means and responsive to said data clock means for counting a present number of data byte clock periods corresponding to a loop established within sequences of said control patterns, said control field decoding means for decoding the control field control pattern and generating said data clock means for clocking said sector counter means and said loop counter means.

12. A disk drive comprising a rotating magnetic recording disk having a data storage surface defining a multiplicity of concentric data tracks, at least one track defining a plurality of fixed-block-length user data block storage locations, the fixed-block length user data block storage locations being divided up into a plurality of irregular byte-length user data segments, each fixed block length user data block storage location having a header field including a plurality of count values, each count value comprising a count of bytes within a corresponding irregular byte-length user data segment, means for reading and transferring user bytes within the at least one track including segments to temporary storage and the count values within header fields to a count value memory stack, count value memory stack control circuitry for pushing the count values onto the count value memory stack as the count values are transferred from a header field, and for popping a count value from the count value memory stack into a segment counter as a corresponding irregular byte-length user data segment is to be read, the segment counter being decremented to zero thereby to determine the irregular byte-length of the user data segment as user bytes from the user data segment are transfered to temporary storage.

13. The disk drive set forth in claim 12 wherein the count values for segments comprising a fixed-block length user data block are pushed onto the count value memory stack in reverse order of occurrence of the segments, so that a count value for a segment first encountered by the means for reading and transferring is at a top of stack location within the count value memory stack and is popped into the segment counter.

* * * * *